United States Patent
Matsunaga et al.

(10) Patent No.: US 7,679,108 B2
(45) Date of Patent: Mar. 16, 2010

(54) SEMICONDUCTOR MEMORY AND FABRICATION METHOD FOR THE SAME

(75) Inventors: Yasuhiko Matsunaga, Kanagawa (JP); Fumitaka Arai, Kanagawa (JP); Makoto Sakuma, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 540 days.

(21) Appl. No.: 11/339,483

(22) Filed: Jan. 26, 2006

(65) Prior Publication Data

US 2006/0244013 A1 Nov. 2, 2006

(30) Foreign Application Priority Data

Mar. 16, 2005 (JP) .................... P2005-075396

(51) Int. Cl.
*H01L 27/10* (2006.01)
(52) U.S. Cl. .............. 257/211; 257/208; 257/209
(58) Field of Classification Search ............ 257/209, 257/208, 211
See application file for complete search history.

(56) References Cited

U.S. PATENT DOCUMENTS 5,332,923 A * 7/1994 Takeuchi .................. 257/758
6,303,952 B1 * 10/2001 Aoki et al. ................ 257/295
2003/0085421 A1 * 5/2003 Takeuchi et al. ........... 257/315

FOREIGN PATENT DOCUMENTS

JP 2003-204001 7/2003

OTHER PUBLICATIONS

U.S. Appl. No. 11/550,636, filed Oct. 18, 2006, Arai et al.
U.S. Appl. No. 11/565,843, filed Dec. 1, 2006, Arai et al.
U.S. Appl. No. 12/408,273, filed Mar. 20, 2009, Hashimoto et al.

* cited by examiner

*Primary Examiner*—Leonardo Andújar
(74) *Attorney, Agent, or Firm*—Oblon, Spivak, McClelland, Maier & Neustadt, L.L.P.

(57) ABSTRACT

A semiconductor memory includes a plurality of active regions; a plurality of bit line contacts disposed on respective active regions; a plurality of first local lines formed in an island shape and in contact with upper surfaces of the plurality of bit line contacts; a plurality of first via contacts in contact with the upper surfaces of the plurality of first local lines and aligned in a direction parallel to the active regions; a first bit line in contact with one of the plurality of first via contacts and extending in a direction parallel to the active regions; and a plurality of second via contacts arranged above the first via contacts that are not in contact with the first bit line through respective second local lines.

9 Claims, 17 Drawing Sheets

SEMICONDUCTOR MEMORY AND FABRICATION METHOD FOR THE SAME

CROSS REFERENCE TO RELATED APPLICATIONS AND INCORPORATION BY REFERENCE

This application is based upon and claims the benefit of priority from prior Japanese Patent Application P2005-075396 filed on Mar. 16, 2005; the entire contents of which are incorporated by reference herein.

BACKGROUND OF THE INVENTION

1. Field of the Invention

The present invention relates to a semiconductor memory. More specifically, it relates to a semiconductor memory that relaxes intervals between bit lines (BL), and prevents defects of a bit line (BL) and a via contact (VIA) due to the bit line and the via contact being very closely disposed, and a fabrication method for the same.

2. Description of the Related Art

In order to implement a large capacity, low cost NAND flash EEPROM, miniaturization of device dimensions and the like, based on a scaling law, is essential. However, because advanced design rules for miniaturization continue to be developed and processing precision becomes more strict as miniaturization progresses, process technologies for implementing a miniaturized NAND flash EEPROM cannot keep pace.

The structure of a NAND flash EEPROM can be substantially divided into a cell array region and a peripheral circuit region. Less strict design rules than those for the cell array region are applied to the peripheral circuit region because processing precision for the peripheral circuit region needs to satisfy desired transistor performance specifications such as electric current and withstand voltage. On the contrary, miniaturization is always being pursued to the limit of process technology because high performance of memory cell transistors that constitute the cell array region is not strongly demanded and a uniform arranged layout is possible.

With the cell array of a conventional NAND flash EEPROM, (1) active regions (AA) and element isolation regions, (2) gate electrodes (CG), (3) bit line contacts (CB), and (4) bit lines (BL) may have minimum fabrication dimensions. Leading-edge, costly apparatus and materials must be adopted in order to implement the above-mentioned processing precision with minimum fabrication dimensions. Accordingly, the more areas with the minimum fabrication dimension, the more the cost increases, resulting in a loss of product competitiveness.

The pitch of particularly bit lines (BL) is the same as that of the active regions (AA) or the element isolating regions (STI), and width of the bit lines (BL) is the same as that of the active regions (AA) or the element isolating regions (STI) when using the conventional interconnecting method. Since ensuring resistivity and maintaining sheet resistance to a degree that does not allow delay are necessary regardless of whether the interconnects become narrower due to miniaturization, interconnect layer thickness is increased and processing difficulty is typically increased due to a scaling law when the same interconnect material is used.

In addition, defects of a bit line (BL) and a via contact (VIA) due to the bit line and the via contact being very closely disposed have recently become more and more evident.

While a NAND flash EEPROM has been taken as an exemplary nonvolatile semiconductor memory thus far, the same issues holds true for other memory operating methods. For example, NOR, DINOR, AND, and AG-AND type memories, which have assist gates adjacent to floating gates, are typical nonvolatile semiconductor memories other than a NAND flash EEPROM (for example, see, Y. Sasago, et. al, "10-MB/s Multi-Level Programming of Gb-Scale Flash Memory Enabled by New AG-AND Cell Technology", Technical Digests of International Electron Devices Meeting, 2002 IEEE, 21.6.1, p. 952-954). These structures share a common problem, i.e., in order to connect memory transistors or select gate transistors to bit lines, there are areas in which bit lines and via contacts are densely aligned.

A NAND EEPROM having a two-dimensional device pattern with twisted bit line electrodes so that coupling noise, which is generated between adjacent bit lines, can be reduced through bit line shielding technology has already been proposed (for example, see Japanese Patent Application Laid-open No. 2003-204001 (FIG. 2)).

SUMMARY OF THE INVENTION

An aspect of the present invention inheres in a semiconductor memory which includes a plurality of active regions; a plurality of bit line contacts disposed on respective active regions; a plurality of first local lines formed in an island shape and in contact with upper surfaces of the plurality of bit line contacts; a plurality of first via contacts in contact with the upper surfaces of the plurality of first local lines and aligned in a direction parallel to the active regions; a first bit line in contact with one of the plurality of first via contacts and extending in a direction parallel to the active regions; and a plurality of second via contacts arranged above the first via contacts that are not in contact with the first bit line through respective second local lines.

Another aspect of the present invention inheres in a semiconductor memory which includes: a plurality of active regions; a plurality of bit line contacts disposed on respective active regions; a plurality of first local lines formed in an island shape and in contact with an upper surface of the plurality of bit line contacts; a plurality of first via contacts in contact with the upper surface of the plurality of first local lines and aligned in a direction parallel to the active regions; a first bit line in contact with one of the plurality of first via contacts and extending in a direction parallel to the active regions; and a plurality of second via contacts arranged in a continuous contact structure above the first via contacts that are not in contact with the first bit line.

Another aspect of the present invention inheres in a semiconductor memory fabrication method which includes: forming a plurality of bit line contacts on a plurality of active regions; forming a plurality of first local lines in an island shape and in contact with an upper surface of the plurality of bit line contacts; forming a plurality of first via contacts in contact with the upper surface of the plurality of first local lines, and aligned in a direction parallel to the active regions; forming a first bit line in contact with one of the plurality of first via contacts, and extending in a direction parallel to the active regions; and forming a plurality of second via contacts arranged above the first via contacts that are not in contact with the first bit line via respective second local lines.

DETAILED DESCRIPTION OF THE INVENTION

Figure 1:
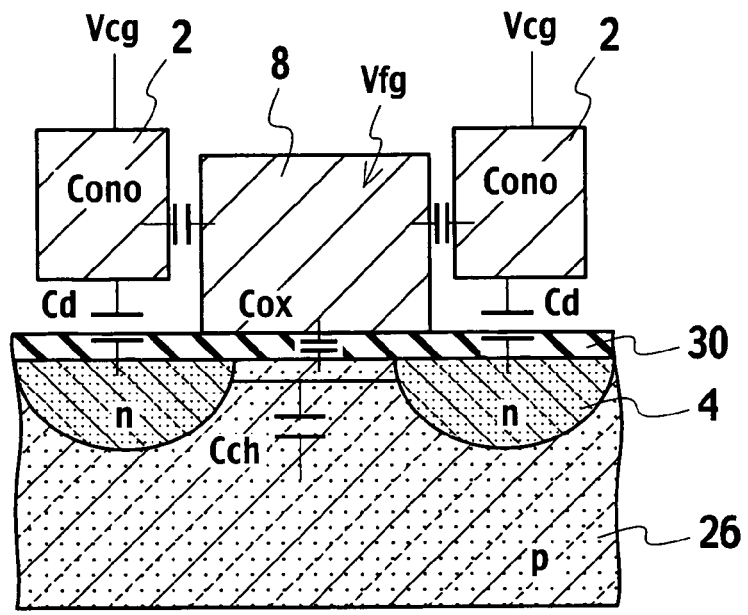
FIG. 1 is a schematic cross-sectional diagram of a basic sidewall control-type structure of a memory cell transistor applied to a semiconductor memory, particularly a nonvolatile semiconductor memory, according to embodiments of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

According to a semiconductor memory of the present invention and a fabrication method for the same, intervals between bit lines (BL) may be relaxed, and defects of a bit line (BL) and a via contact (VIA) due to the bit line and the via contact being very closely disposed may be prevented.

First through sixth embodiments of the present invention are described forthwith while referencing the drawings. The same or similar symbols are given to the same or similar parts throughout the appended drawings. However, it should be noted that the drawings are merely schematics in which the relationship among thickness and planar dimension and the ratio of respective layer thicknesses and the like differ from those of the actual invention. Accordingly, specific thicknesses and dimensions should be determined while considering the following description. Furthermore, it is needless to say that parts with differing dimensions and/or differing ratios among the drawings may be included.

In addition, the first through sixth embodiments given forthwith illustrate devices and methods for embodying the technical idea of the present invention, and that technical idea of the present invention is not limited to the following materials, shapes, structures, arrangements or the like. The technical idea of the present invention may be modified into various modifications within the scope of the appended claims.

Comparative Example

First, as shown in FIGS. 17 and 18, the study example as a basis for the embodiments of the present invention has typical bit line interconnects in a memory cell array region of a nonvolatile semiconductor memory.

Figure 17A:
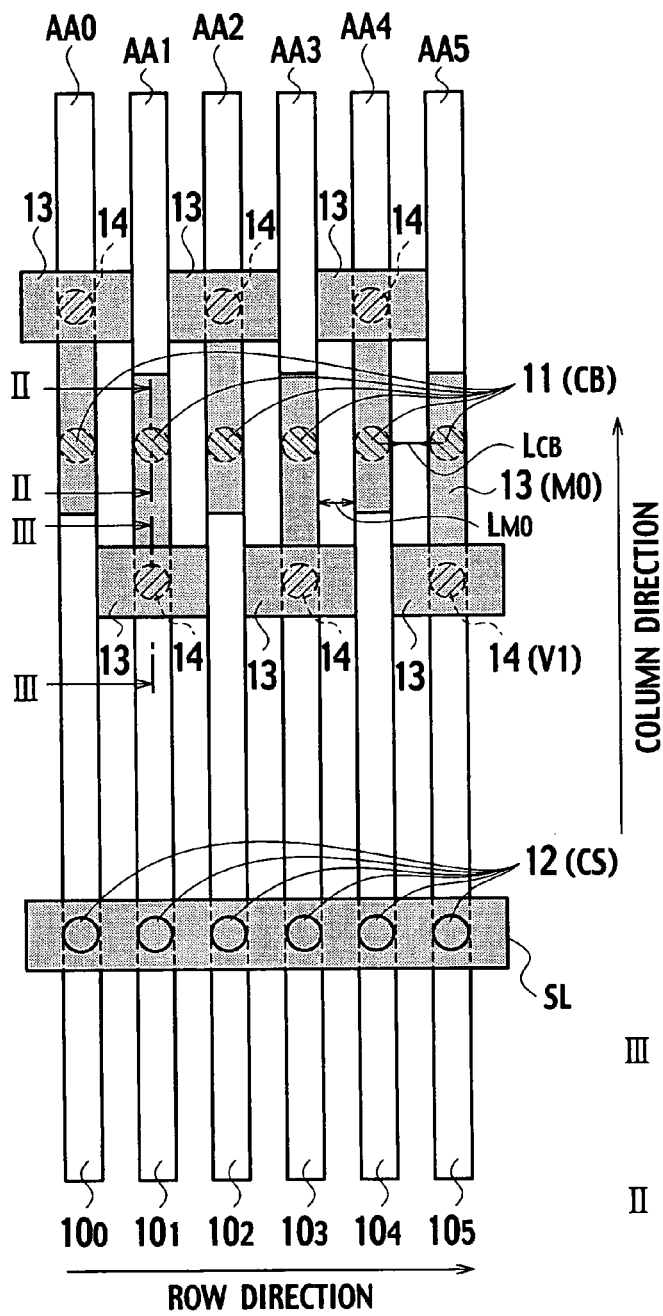
FIG. 17A is a schematic device planar pattern diagram of a semiconductor memory, particularly a nonvolatile semiconductor memory, according to a study example, which has bit line contacts (CB), first metal layers (MO), and first via contacts (V1) formed on active regions (AA)
Figure 17B:
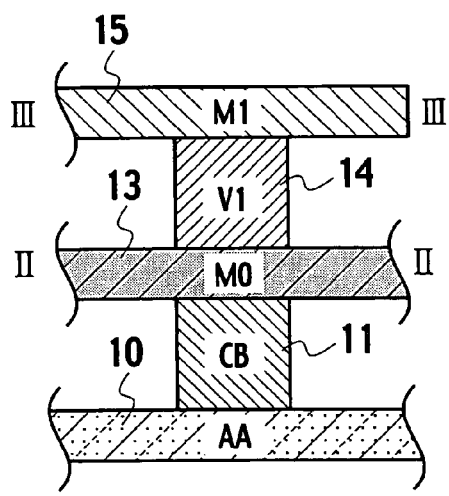
FIG. 17B is a schematic cross-sectional diagram of the semiconductor memory, particularly the nonvolatile semiconductor memory, according to the study example, cut along the lines II-II and III-III of FIG. 17A.
Figure 18A:
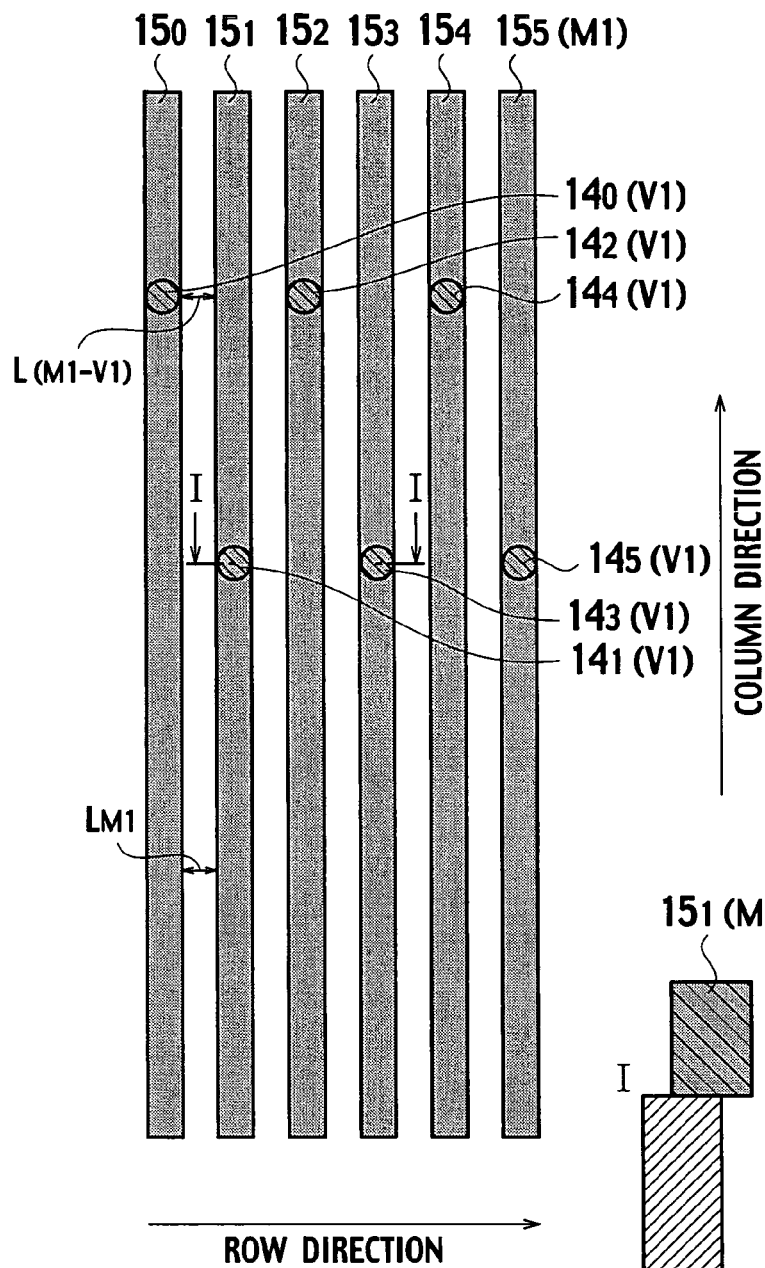
FIG. 18A is a schematic device planar pattern diagram of the semiconductor memory, particularly the nonvolatile semiconductor memory, according to the study example, which has second metal layers (M1) formed on the first via contacts (V1)
Figure 18B:
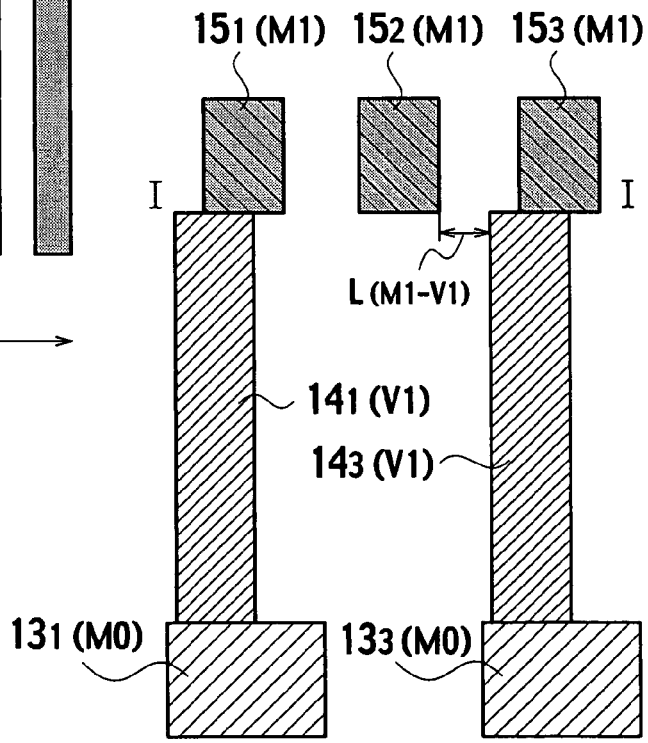
FIG. 18B is a schematic cross-sectional diagram of the semiconductor memory, particularly the nonvolatile semiconductor memory, according to the study example, cut along the line I-I of FIG. 18A.

FIG. 17A is a schematic device planar pattern diagram of the nonvolatile semiconductor memory, according to the study example, which has bit line contacts CB, first metal layers MO, and first via contacts V1 formed on active regions (AA). FIG. 17B is a schematic cross-sectional diagram cut along the lines II-II and III-III of FIG. 17A. FIG. 18A is a schematic device planar pattern diagram of the nonvolatile semiconductor memory, according to the study example, which has second metal layers M1 formed on the first via contacts V1. FIG. 18B is a schematic cross-sectional diagram cut along the line I-I of FIG. 18A. Note that although FIG. 17B shows a second metal layer 15 (M1) arranged on a first via contact 14 (V1), the second metal layer 15 (M1) is omitted from FIG. 17A. As shown in FIG. 18A, second metal layers 15 (M1) are disposed along the bit line BL length above respective active regions 10 (AA). Furthermore, in FIG. 17B, two schematic cross-sectional structures cut along the lines II-II and III-III are combined.

As shown in FIG. 17A, the nonvolatile semiconductor memory according to the study example comprises multiple active regions $10_0$ (AA0), $10_1$ (AA1), $10_2$ (AA2), $10_3$ (AA3), $10_4$ (AA4), $10_5$ (AA5), . . . , which extend along the bit line BL length (in a column direction), bit line contacts 11 (CB) and source line contacts 12 (CS) connected to respective active regions $10_0$ (AA0), $10_1$ (AA1), $10_2$ (AA2), $10_3$ (AA3), $10_4$ (AA4), $10_5$ (AA5), . . . and arranged in a column along the word line WL length, first local lines of first metal layers 13 (MO) arranged in an island shape and connected to the bit line contacts 11 (CB), a source line SL of a first metal layer 13 (MO) linearly extending along the word line length and connected to the source line contacts 12 (CS) in common, and first via contacts 14 (V1) arranged on the first local lines. As shown in FIG. 18A, the memory further comprises the second metal layers 15 (M1) extending along the bit line BL length and connected to the respective first via contacts 14 (V1). The bit line contacts (CB) 11 are formed in a column extending along the word line length.

Next, as shown in FIG. 17A, the local lines of first metal layers 13 (MO) are alternately extended, and the first via contacts 14 (V1) are arranged on the first metal layers 13 (MO). This prevents the first via contacts 14 (V1) from being disposed with minimum fabrication dimensions.

As shown in FIG. 18A, second metal layers $15_0$ (M1), $15_1$ (M1), $15_2$ (M1), $15_3$ (M1), $15_4$ (M1), $15_5$ (M1), constituting respective bit lines BL are stacked on respective first via contacts $14_0$ (V1), $14_1$ (V1), $14_2$ (V1), $14_3$ (V1), $14_4$ (V1), $14_5$ (V1), . . . . Accordingly, as shown in FIG. 18A, the bit lines BL are formed with minimum fabrication dimensions.

Typically, the diameter of the first via contacts 14 (V1) is set approximately the same as the bit line width. However, taking dimensional fluctuation and misalignment of bit line BL and via contact diameters into consideration, distance $L_{(M1\text{-}V1)}$ between each bit line BL and adjacent first via contact 14 (V1) may be smaller than inter-bit line distance $L_{M1}$, as shown in FIGS. 18A and 18B. Therefore, there is a high rate of short circuits occurring between a bit line BL and a first via contact 14 (V1) very closely disposed to the bit line. Furthermore, since the potential difference between adjacent bit lines BL in a memory cell array is approximately equivalent to a power supply voltage at most, high voltage will not be applied thereto. However, impairment of insulative characteristics in the area having a distance $L_{(M1\text{-}V1)}$ between a bit line BL and adjacent first via contact 14 (V1) and ultimately results in a dielectric breakdown due to repetitive application of the power supply voltage between the bit lines BL.

In order to accommodate future miniaturization and reduce processing difficulty and cost, relaxing the pitch of (4) bit lines (BL) is desired.

(Basic Cell Structure)

A basic structure of the memory cell transistors for a semiconductor memory, particularly a nonvolatile semiconductor memory, according to the embodiments of the present invention comprises a sidewall control-type structure as shown in the schematic cross-sectional diagram of FIG. 1. The sidewall control gate structure comprises diffusion layers 4 formed in a semiconductor substrate 26 which become a source region or a drain region, a tunneling insulator film 30 formed on the semiconductor substrate 26, a floating gate 8 formed on a channel region sandwiched between the diffusion layers 4 via the tunneling insulator film 30, and first and second control gates 2 formed adjacent to the two sidewalls of the floating gate 8 via an inter-gate insulator film and facing the diffusion layers 4.

Figure 2:
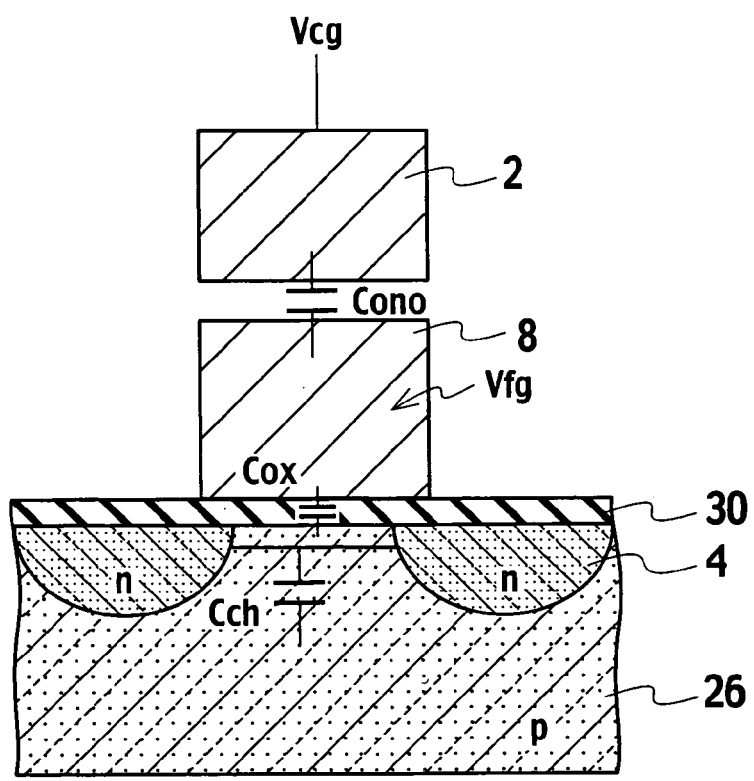
FIG. 2 is a schematic cross-sectional diagram of a basic stacked gate structure of a memory cell transistor applied to a semiconductor memory, particularly a nonvolatile semiconductor memory, according to the embodiments of the present invention.

Another basic structure of memory cell transistors for a semiconductor memory, particularly a nonvolatile semiconductor memory, according to the embodiments of the present invention comprises a stacked gate structure as shown in the schematic cross-sectional diagram of FIG. 2. The stacked gate structure comprises: diffusion layers 4 formed in a semiconductor substrate 26 which become a source region or a drain region; a tunneling insulator film 30 formed on the semiconductor substrate 26; a floating gate 8 formed on a channel region sandwiched between the diffusion layers 4 via the tunneling insulator film 30; and a control gate 2, formed on the floating gate 8 via an interlayer insulator film.

According to the sidewall control gate structure, the parasitic capacitance around the floating gate 8 can be reduced, and increasing the capacitance between the control gate 2 and the floating gate 8 decreases the write-in voltage $V_{pgm}$ and provides a nonvolatile semiconductor memory capable of high integration and high-speed performance. The sidewall control gate structure must have two control gate lines, while only one is necessary for the stacked gate structure. Thus the memory cell array with the stacked gate structure has a simpler circuitry. However, in an actual matrix structure, the number of control gate lines in the sidewall control gate structure is actually only one more than in the stacked gate structure. This is because two memory cells may be controlled by a single control gate.

The basic structure of a memory cell transistor of the semiconductor memory, particularly a nonvolatile semiconductor memory, according to the embodiments of the present invention, may employ either the sidewall control-type structure or the stacked gate structure.

First Embodiment (Semiconductor Memory)

Figure 3A:
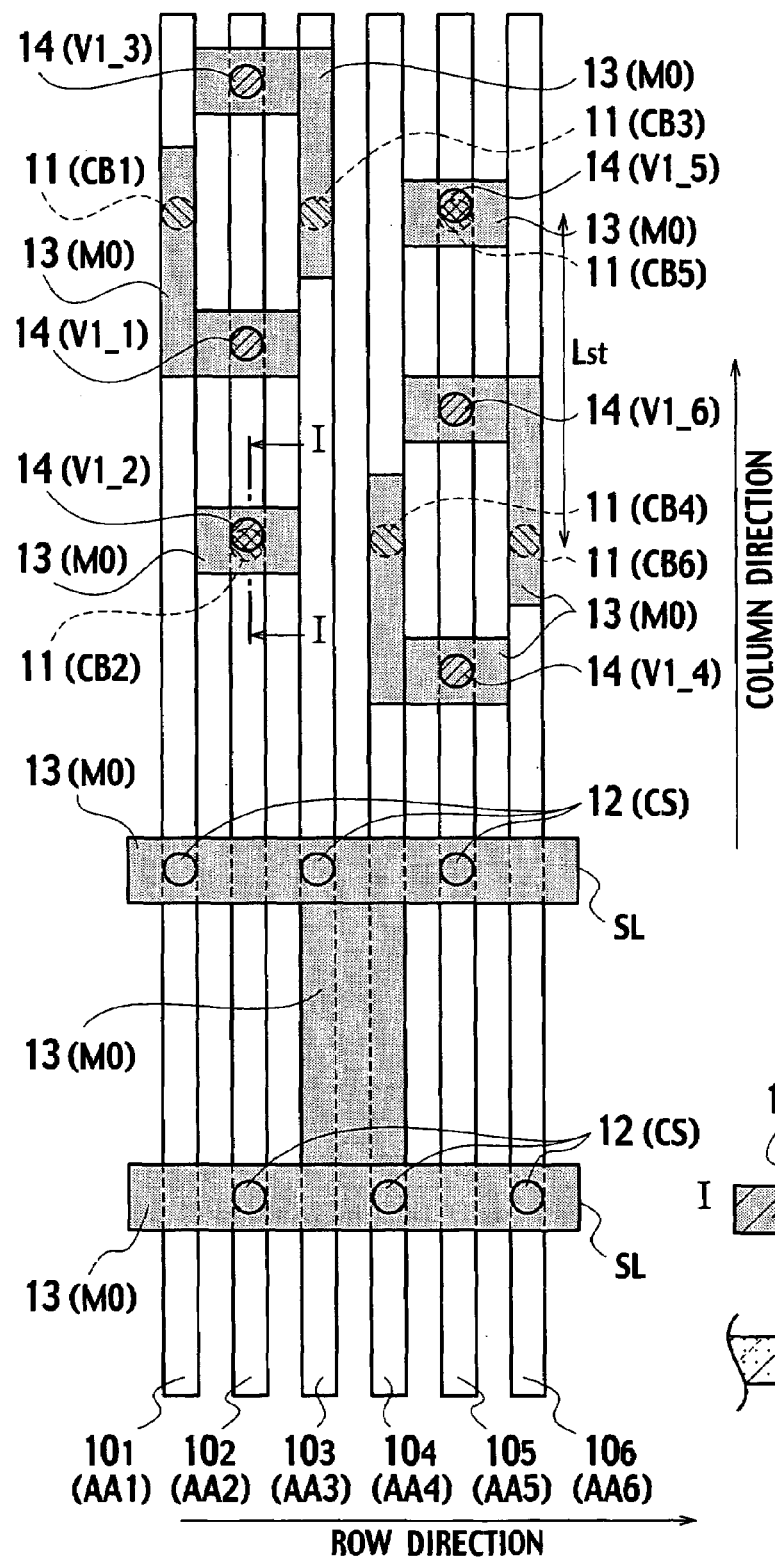
FIG. 3A is a schematic device planar pattern diagram of a semiconductor memory, particularly a nonvolatile semiconductor memory, according to a first embodiment of the present invention, which has bit line contacts (CB), first metal layers (MO), and first via contacts (V1) formed on active regions (AA)
Figure 3B:
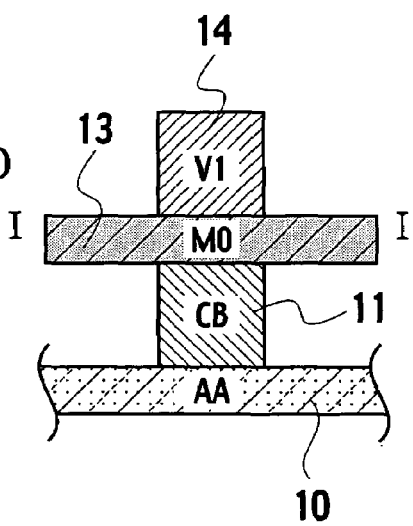
FIG. 3B is a schematic cross-sectional diagram of the semiconductor memory, particularly the nonvolatile semiconductor memory, according to the first embodiment of the present invention, cut along the line I-I of FIG. 3A.
Figure 4A:
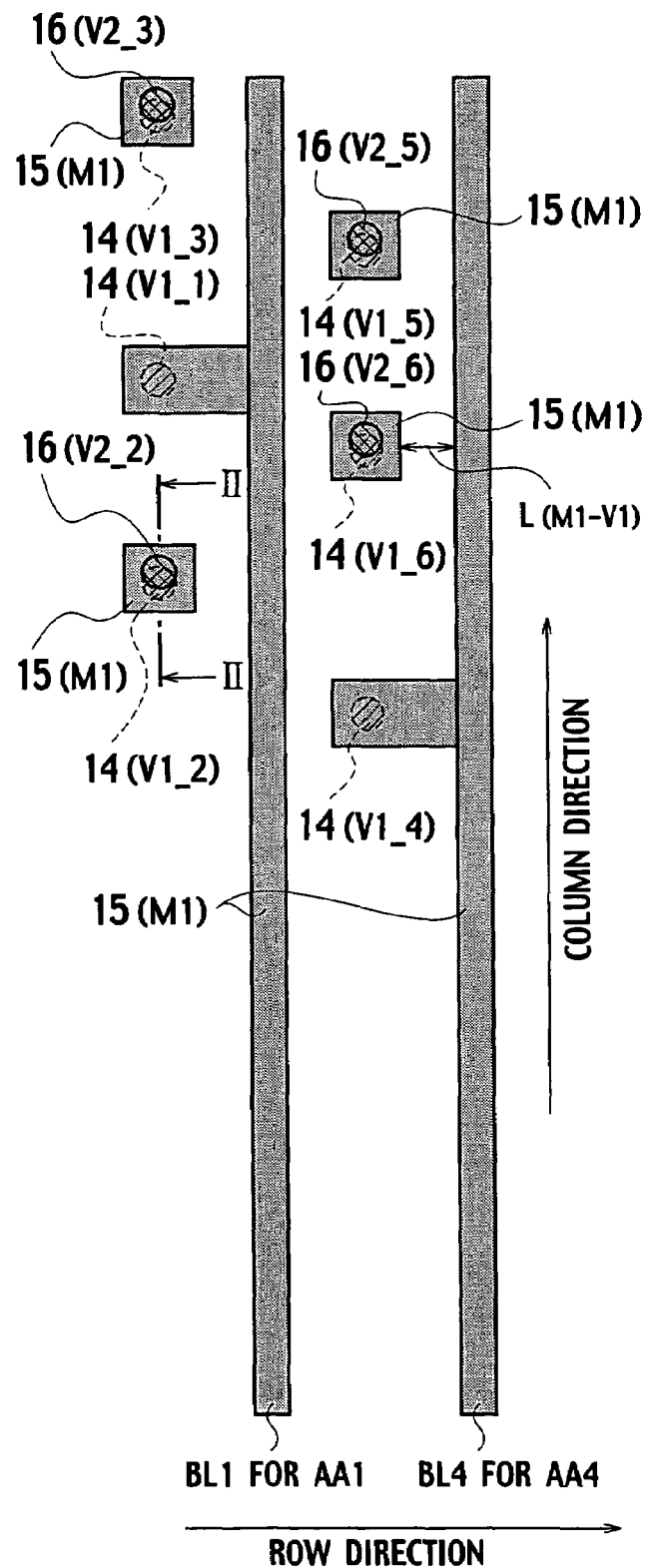
FIG. 4A is a schematic device planar pattern diagram of the semiconductor memory, particularly the nonvolatile semiconductor memory, according to the first embodiment of the present invention, which has second metal layers (M1) and second via contacts (V2) formed on the first via contacts (V1)
Figure 4B:
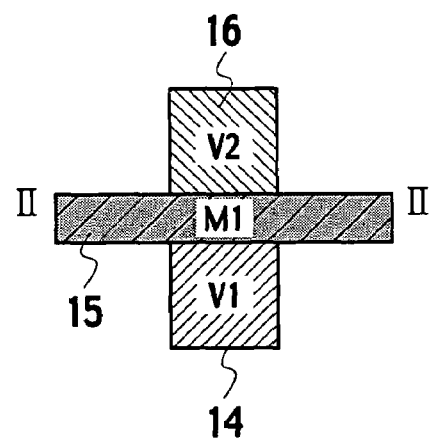
FIG. 4B is a schematic cross-sectional diagram of the semiconductor memory, particularly the nonvolatile semiconductor memory, according to the first embodiment of the present invention, cut along the line II-II of FIG. 4A.

A shown in FIGS. 3 and 4, a semiconductor memory according to the first embodiment of the present invention comprises: multiple active regions $10_1$ (AA1), $10_2$ (AA2), $10_3$ (AA3), $10_4$ (AA4), $10_5$ (AA5), $10_6$ (AA6), . . . ; multiple bit line contacts 11 (CB1), 11 (CB2), 11 (CB3), 11 (CB4), 11 (CB5), 11 (CB6) and source line contacts 12 (CS) arranged on the respective active regions $10_1$ (AA1), $10_2$ (AA2), $10_3$ (AA3), $10_4$ (AA4), $10_5$ (AA5), $10_6$ (AA6), . . . . The semiconductor memory also comprises first local lines, which contact the respective bit line contacts 11 (CB1), 11 (CB2), 11 (CB3), 11 (CB4), 11 (CB5), 11 (CB6) and which are made of multiple first metal layers 13 (MO) formed in an island shape; source lines SL, each connected in common to the source line contacts 12 (CS), made of first metal layers 13 (MO) and linearly extending along the word line WL length; multiple first via contacts 14 (V1_1), 14 (V1_2), 14 (V1_3), 14 (V1_4), 14 (V1_5), 14 (V1_6), which contact the first local lines and are aligned in a direction parallel to the active regions (column direction along the bit line BL length). A first bit line group (BL1 and BL4 of FIG. 4, for example) is formed of second metal layers 15 (M1) and contacts the first via contacts 14 (V1_1) and 14 (V1_4) of multiple first via contacts 14 (V1), and extends in a direction parallel to the active regions. Multiple second via contacts 16 (V2_2, 16 (V2_3), 16 (V2_5), and 16 (V2_6) are disposed via second local lines made of second metal layers 15 (M1) on the first via contacts 14 (V1_2) and 14 (V1_3) or 14 (V1_5) and 14 (V1_6) of the multiple first via contacts 14 (V1) that do not contact the first bit line group.

Figure 5A:
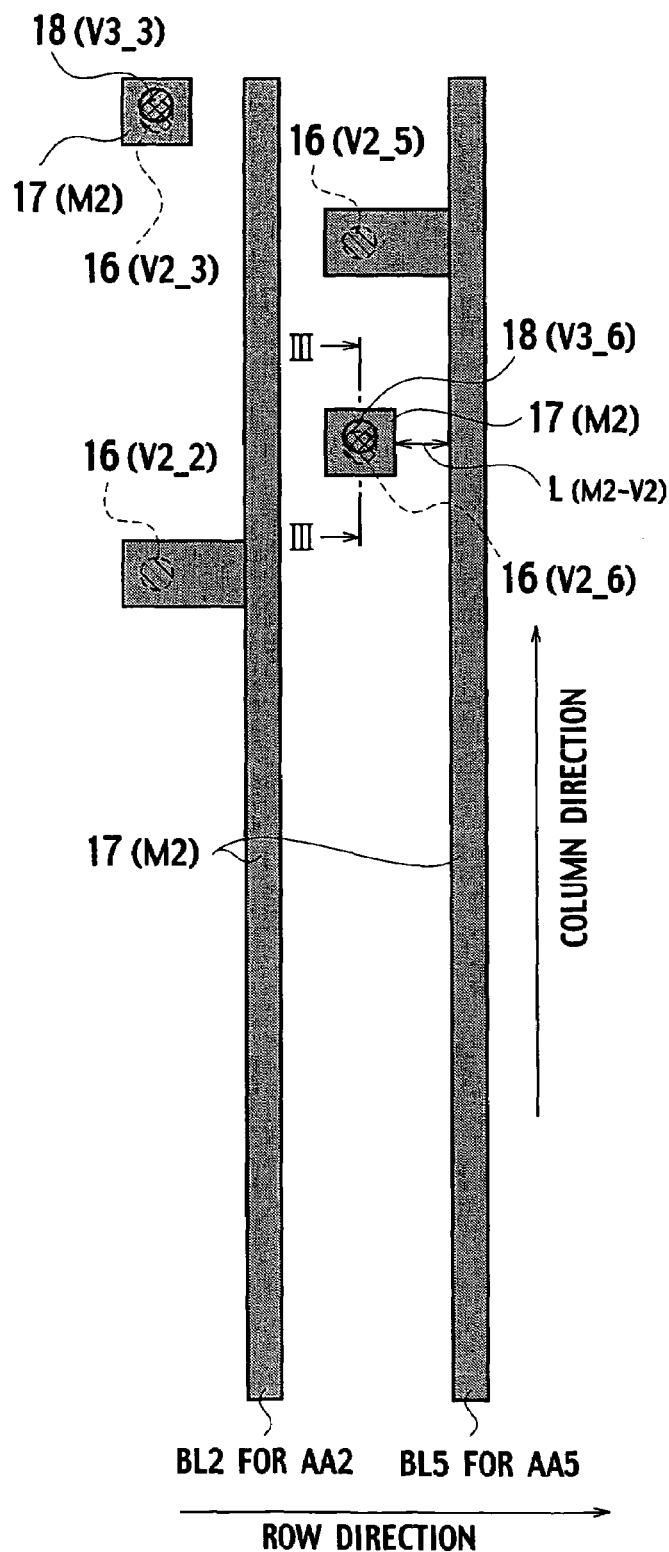
FIG. 5A is a schematic device planar pattern diagram of the semiconductor memory, particularly the nonvolatile semiconductor memory, according to the first embodiment of the present invention, which has third metal layers (M2) and third via contacts (V3) formed on the second via contacts (V2)
Figure 5B:
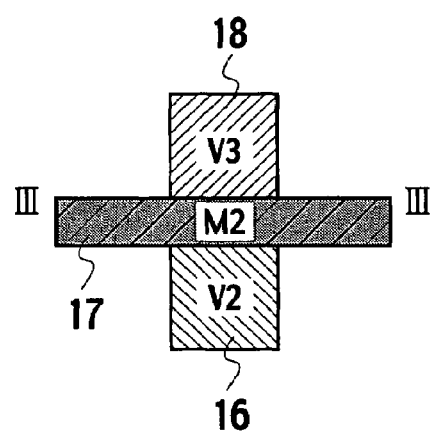
FIG. 5B is a schematic cross-sectional diagram of the semiconductor memory, particularly the nonvolatile semiconductor memory, according to the first embodiment of the present invention, cut along the line III-III of FIG. 5A.

Furthermore, as shown in FIG. 5, the semiconductor memory according to the first embodiment of the present invention comprises a second bit line group (BL2 and BL5 of FIG. 5, for example) is formed of third metal layers 17 (M2), which contact one of the second via contacts 14 (V2_2) and 14 (V2_5) of the multiple second via contacts 16 (V2_2, 16 (V2_3), 16 (V2_5), and 16 (V2_6), and has portions extending in a direction parallel to the active regions.

Figure 6A:
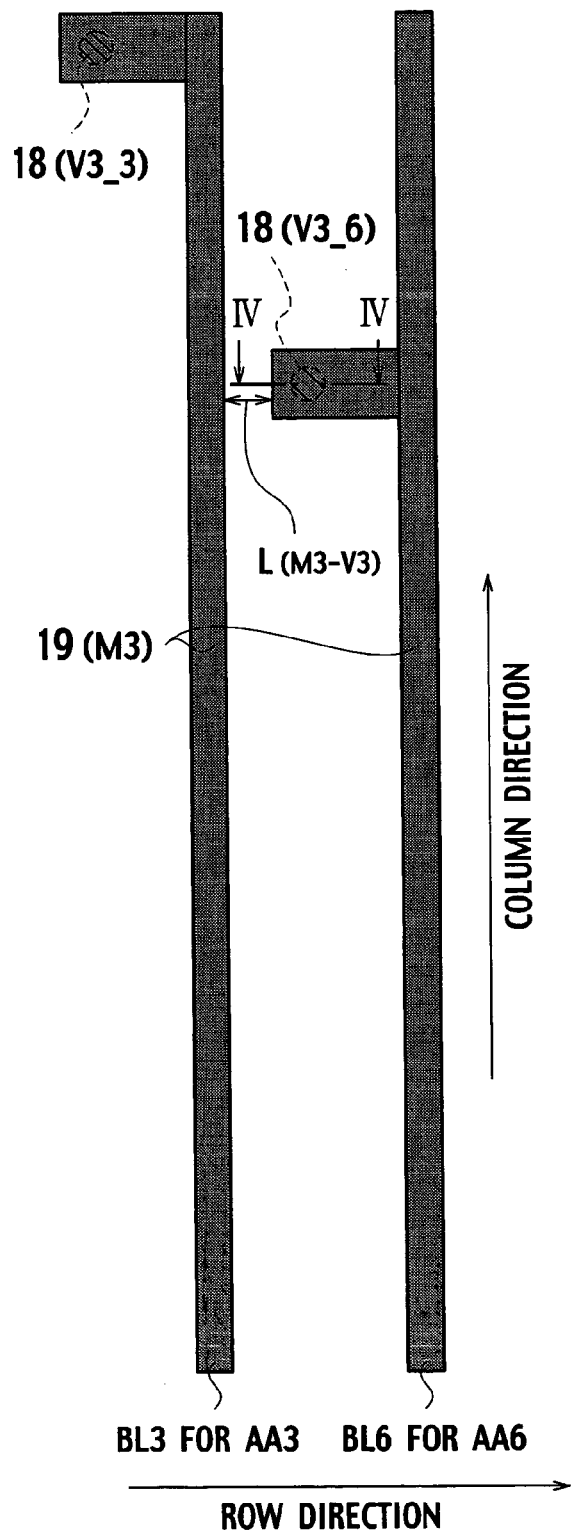
FIG. 6A is a schematic device planar pattern diagram of the semiconductor memory, particularly the nonvolatile semiconductor memory, according to the first embodiment of the present invention, which has fourth metal layers (M3) formed on the third via contacts (V3)
Figure 6B:
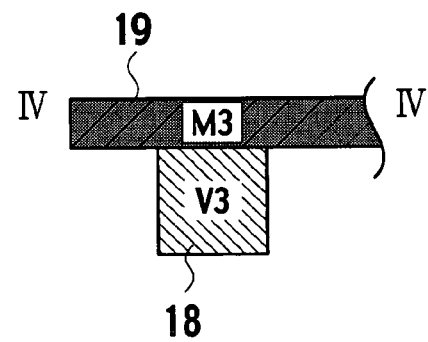
FIG. 6B is a schematic cross-sectional diagram of the semiconductor memory, particularly the nonvolatile semiconductor memory, according to the first embodiment of the present invention, cut along the line IV-IV of FIG. 6A.

As shown in FIGS. 5 and 6, the semiconductor memory further comprises multiple third via contacts 18 (V3) disposed, via third local lines of third metal layers 17 (M2), on the second via contacts 16 (V2_3) and 16 (V2_6) of the multiple second via contacts 16 (V2) that do not contact the second bit line group. A third bit line group (BL3 and BL6 of FIG. 6, for example) formed of fourth metal layers 19 (M3) contacts one of the third via contacts 18 (V3_3) and 18 (V3_6) of the multiple third via contacts 18 (V3), and extends in a direction parallel to the active regions.

A case of relaxing intervals between bit lines BL in FIG. 3 to 'minimum fabrication dimension F', namely 1.5 times width F, of the device regions or element isolating regions is described.

Assuming a minimum unit for micro-fabrication based on the scaling law as F, widths of the active regions AA and widths of gate electrodes CG typically are the minimum micro-fabrication dimension F, where the minimum pitch (=cycle) dimension is denoted by 2F. With the semiconductor memory, since "the interconnect 'minimum pitch' is multiplied by 1.5", the pitch is 3F. The pitch 3F may be used in two ways. The first method is to set M1L=M1S=1.5F when the line width of the second metal layers M1 is M1L and the space is M1S. The same holds for the third metal layers M2 and the fourth metal layers M3. The second method is to set M1L<M1S. For example, M1L=1F and M1S=2F. The first method is technologically easier for processing. Use of the second method is suitable where formation of lines having width L, based on the minimum micro-fabrication dimension F, is possible and a remnant insulating film needs to be secured. FIGS. 5 and 6 showing the fabrication method for the semiconductor memory, according to the first embodiment of the present invention, have dimensions corresponding to the second method. In other words, the minimum space value changes based on how the pitch 3F is utilized.

'Minimum micro-fabrication dimension F' is a dimension defined by the minimum pattern width for micro-fabrication based on the scaling law. FIG. 3, for example, describes that dimension F corresponds to the width of the multiple active regions $10_1$ (AA1), $10_2$ (AA2), $10_3$ (AA3), $10_4$ (AA4), $10_5$ (AA5), $10_6$ (AA6) extending along the bit line BL length. Alternatively, the dimension F corresponds to the width of each element isolating region between the active regions.

(Semiconductor Memory Fabrication Method)

A semiconductor memory fabrication method, according to the first embodiment of the present invention, relaxes intervals between the bit lines BL, as shown in FIGS. 3 through 6.

A shown in FIGS. 3 and 4, the semiconductor memory fabrication method comprises forming multiple bit line contacts 11 (CB1), 11 (CB2), 11 (CB3), 11 (CB4), 11 (CB5), 11 (CB6) and source line contacts 12 (CS) arranged on respective active regions $10_1$ (AA1), $10_2$ (AA2), $10_3$ (AA3), $10_4$ (AA4), $10_5$ (AA5), $10_6$ (AA6), . . . ; forming first local lines, which contact the respective bit line contacts 11 (CB1), 11 (CB2), 11 (CB3), 11 (CB4), 11 (CB5), 11 (CB6) and made of multiple first metal layers 13 (MO) formed in an island shape, and source lines SL, each connected in common to the source line contacts 12 (CS), of respective first metal layers 13 (MO)

and linearly extended along the word line WL length; forming multiple first via contacts 14 (V1_1), 14 (V1_2), 14 (V1_3) or first via contacts 14 (V1_4), 14 (V1_5), 14 (V1_6), which contact the first local lines and are aligned in a direction parallel to the active regions (column direction: along the bit line BL length); forming a first bit line group BL1 and BL4 formed of second metal layers 15 (M1) is contact with the first via contacts 14 (V1_1) and 14 (V1_4) of the multiple first via contacts 14 (V1), that extends in a direction parallel to the active regions; and forming multiple second via contacts 16 (V2_2, 16 (V2_3), 16 (V2_5), and 16 (V2_6) disposed on the first via contacts 14 (V1_2) and 14 (V1_3) or 14 (V1_5) and 14 (V1_6) of the multiple first via contacts 14 (V1) that do not contact the first bit line group via second local lines made of second metal layers 15 (M1).

As shown in FIG. 5, the semiconductor memory fabrication method further comprises forming a second bit line group (BL2 and BL5 of FIG. 5, for example) formed of third metal layers 17 (M2) contacting one of the second via contacts 14 (V2_2) and 14 (V2_5) of the multiple second via contacts 16 (V2_2, 16 (V2_3), 16 (V2_5), and 16 (V2_6), including portions extending in a direction parallel to the active regions.

As shown in FIGS. 5 and 6, the semiconductor memory fabrication method further comprises forming multiple third via contacts 18 (V3_3) and 18 (V3_6) disposed on the second via contacts 16 (V2_3) and 16 (V2_6) of the multiple second via contacts 16 (V2) that do not contact the second bit line group via third local lines, made of third metal layers 17 (M2); and forming a third bit line group (BL3 and BL6 of FIG. 6, for example) formed of fourth metal layers 19 (M3), contacting one of the third via contacts 18 (V3_3) and 18 (V3_6) of the multiple third via contacts 18 (V3), extending in a direction parallel to the active regions.

The fabrication method for the semiconductor memory, according to the first embodiment of the present invention, for relaxing intervals between the bit lines BL is described in further detail.

Firstly, as shown in FIG. 3, the first via contacts 14 (V1_1), 14 (V1_2), and 14 (V1_3) connected to the bit line contacts 11 (CB) on three active regions $10_1$ (AA1), $10_2$ (AA2), and $10_3$ (AA3), respectively, are disposed, for example, right above a single line along the bit line BL length such as active region $10_2$ (AA2) using the local lines of the first metal layers 14 (MO).

In the same manner, as shown in FIG. 3, the first via contacts 14 (V1_4), 14 (V1_5), and 14 (V1_6) connected to the bit line contacts 11 (CB) on three active regions $10_4$ (AA4), $10_5$ (AA5), and $10_6$ (AA6), respectively, are disposed, for example, right above a single line along the bit line BL length such as active region $10_5$ (AA5).

Accordingly, the bit line contacts (CB) are formed in every other active region patterned along the word line WL length. This is possible because there is ample space to dispose the first via contacts 14 (V1), due to the pitch of the first via contacts 14 (V1) along the bit line BL length being sufficiently longer than the pitch along the word line WL length, as shown in FIG. 17, for example. In other words, the first via contacts 14 (V1_1), 14 (V1_2) and 14 (V1_3) or 14 (V1_4), 14 (V1_5) and 14 (V1_6) connected to multiple active regions $10_1$ (AA1), $10_2$ (AA2) and $10_3$ (AA3) or $10_4$ (AA4), $10_5$ (AA5) and $10_6$ (AA6) can be disposed in the same line, respectively, utilizing this space.

Next, as shown in FIG. 4, the first via contacts 14 (V1_1) and 14 (V1_4) are respectively connected using the bit lines BL1 and BL4 made of the second metal layers 15. The second local lines made of the second metal layers 15 (M1) are formed at the other first via contacts 14 (V1_2) and 14 (V1_3).

The distance between the center of each of the bit lines BL1 and BL4 and the center of an adjacent one of the first via contacts 14 (V1) is 3F. The width of BL1 and BL4 may be set between 1F and 1.5F. For example, if the width of BL1 and BL4 can be formed as F, the distance $L_{(M1-V1)}$ of the smallest space is 2F. Otherwise, if the width of BL1 and BL4 is 1.5F, the distance $L_{(M1-V1)}$ of the smallest space is 1.5F. These facts show that the distance $L_{(M1-V1)}$ of the smallest space can be relaxed to be between 1.5F to 2F, in comparison to the conventional case.

Next, as shown in FIG. 4, the second via contacts 16 (V2_2), 16 (V2_3), 16 (V2_5), and 16 (V2_6) are formed on the first via contacts 14 (V1_2), 14 (V1_3), 14 (V1_5), and 14 (V1_6), which are not connected to the bit lines BL1 and BL4, via the second local lines of second metal layers 15 (M1).

Next, as shown in FIG. 5, the second via contacts 16 (V2_2) and 16 (V2_5) are respectively connected using the bit lines BL2 and BL5 of third metal layers 17 (M2). Local lines of third metal layers 17 are formed at the other second via contacts 16 (V2_3) and 16 (V2_6).

Even the distance $L_{(M2-V2)}$ of the smallest space of the bit lines BL2 and BL5 is 1.5F to 2F, thereby relaxing the design rule.

Next, as shown in FIG. 5, the third via contacts 18 (V3_3) and 18 (V3_6) are formed on the second via contacts 16 (V2_3) and 16 (V2_6), which are not connected to the bit lines BL2 and BL5, via the third local lines of third metal layers 17 (M2).

As shown in FIG. 6, the third via contacts 18 (V3_3) and 18 (V3_6) are respectively connected using the bit lines BL3 and BL6 of fourth metal layers 19 (M3).

Even the distance $L_{(M3-V3)}$ of the smallest space of the bit lines BL3 and BL6 is 1.5F to 2F, thereby relaxing the design rule.

Accordingly, use of four metal layers: the first metal layer 13 (MO), the second metal layer 15 (M1), the third metal layer 17 (M2), and the fourth metal layer (M3) allows the pitch for interconnects to be relaxed to 1.5F.

The number of metal layers is not limited to four. In general, the pitch may be relaxed to (n−1)/2 times by using n metal layers (n is an integer of four or greater). In comparison with the study example, this is an extremely important method, even though cost will increase due to an increase in the number of interconnect layers in the case where process costs based on the minimum fabrication dimension F are high or in the case where processing based on the minimum fabrication dimension F is impossible. Furthermore, additional interconnect layers may be used in a combination logic circuit region without cost increase.

A proximal portion of dimensions generated between a bit line BL formed of the second metal layer 15 (M1) and a via contact 14 (V1) regardless of how the bit line contacts 11 (CB) are arranged.

The structure of the semiconductor memory according to the embodiments of the present invention and the fabrication method for the same can be used without particular limitations, such as how to arrange the bit line contacts 11 (CB).

For example, as shown in FIG. 17 of the study example, the structure of the semiconductor memory according to the first embodiment of the present invention and the fabrication method for the same may be applied to the semiconductor memory having a structure of the bit line contacts (CB) being closely disposed along the word line length. Alternatively, as shown in FIG. 3, the structure of the semiconductor memory according to the first embodiment of the present invention and the fabrication method for the same may also be applied to a semiconductor memory having the bit line contacts 11 (CB) disposed in every other active region along the word line length.

The structure of the semiconductor memory can be applied to a NAND structure comprising, for example, a memory cell unit, which has electronic data writable and erasable memory cell transistors arranged along the bit line BL length, and bit line contacts 11 (CB) disposed on active regions shared between memory cell arrays having the multiple memory cell units connected in series along the bit line BL length, at both ends of the memory cell arrays. The multiple memory cell arrays are arranged in a matrix along the word line WL length.

In FIG. 3, a portion designated by distance $L_{st}$ corresponds to a memory cell unit, and respective bit line contacts 11 (CB) on the active regions are shared between respective memory cell units. Such structure of the semiconductor memory may be implemented by taking into account of the driving method of the NAND cell array.

With the semiconductor memory of the first embodiment of the present invention, particularly with a nonvolatile semiconductor memory having a NAND circuit structure, a case of arranging bit line contacts CB has been described; however, the arranging method for the bit line contacts CB may vary.

According to the semiconductor memory of the first embodiment of the present invention and the fabrication method for the same, intervals between bit lines (BL) may be relaxed, and defects of a bit line (BL) and a via contact (VIA), due to being very closely disposed, may be prevented. Furthermore, the inter-bit line contact distance may be relaxed, and yield may improve.

First Modified Example of the First Embodiment (Continuous Contact Structure)

With the semiconductor memory according to a first modified example of the first embodiment of the present invention, a 'continuous contact' structure where the bit line contacts 11 (CB) and the first via contacts 14 (V1) are connected without sandwiching the first metal layers 13 (M0).

For example, in a structure comprised of the bit line contact 11 (CB), the first metal layer 13 (M0), and the first via contact 14 (V1), the first metal layers 13 (M0) in contact with the bit line contacts 11 (CB2) and 11 (CB5) are unnecessary when the continuous contact structure is used.

In addition, in a structure comprised of the first via contact 14 (V1), the second metal layer 15 (M1), the second via contact 16 (V2), the second metal layers 15 (M1) in contact with the second via contacts 16 (V2_2), 16 (V2_3), 16 (V2_5), and 16 (V2_6) are unnecessary when the continuous contact structure is used.

Similarly, in a structure comprised of the second via contact 16 (V2), the third metal layer 17 (M2), and the third via contact 18 (V3), the third metal layers 17 (M2) in contact with the third via contacts 18 (V3_3) and 18 (V3_6) are unnecessary when the continuous contact structure is used.

According to the semiconductor memory of the first modified example of the first embodiment, use of the continuous contact structure omits square M0, M1, and M2 having sides of the minimum dimension F and also omits of fringes of square M0, M1, and M2 attached to compensate for misalignment, and thereby increasing the minimum dimensional spacing.

Second Modified Example of the First Embodiment

With the semiconductor memory according to a second modified example of the first embodiment, a 'source line local interconnect (LI) structure' has source lines SL formed by filling polysilicon or a metal in linearly cut grooves. The 'source line LI structure' provides source line contacts 12 (CS) laterally connected together along the word line WL length.

As shown in FIG. 3, with the semiconductor memory, according to the first embodiment of the present invention, the source line contacts 12 (CS) standing upright and extending to the respective first metal layers 13 (M0) forms source lines SL. However, it is apparent that the source line contacts 12 (CS) standing upright and extending to the respective first metal layers 13 (M0) are not always needed. With the semiconductor memory according to the second modified example, an interconnect structure may be made by filling polysilicon or a metal in linearly cut grooves and thereby forming the source lines SL.

The semiconductor memory according to the second modified example has merit in that, since formation of the source line contacts 12 (CS) is not necessary due to the interconnect structure made by filling polysilicon or a metal in linearly cut grooves to form the source lines SL, the manufacturing process can be simplified.

Second Embodiment (Semiconductor Memory)

Figure 7A:
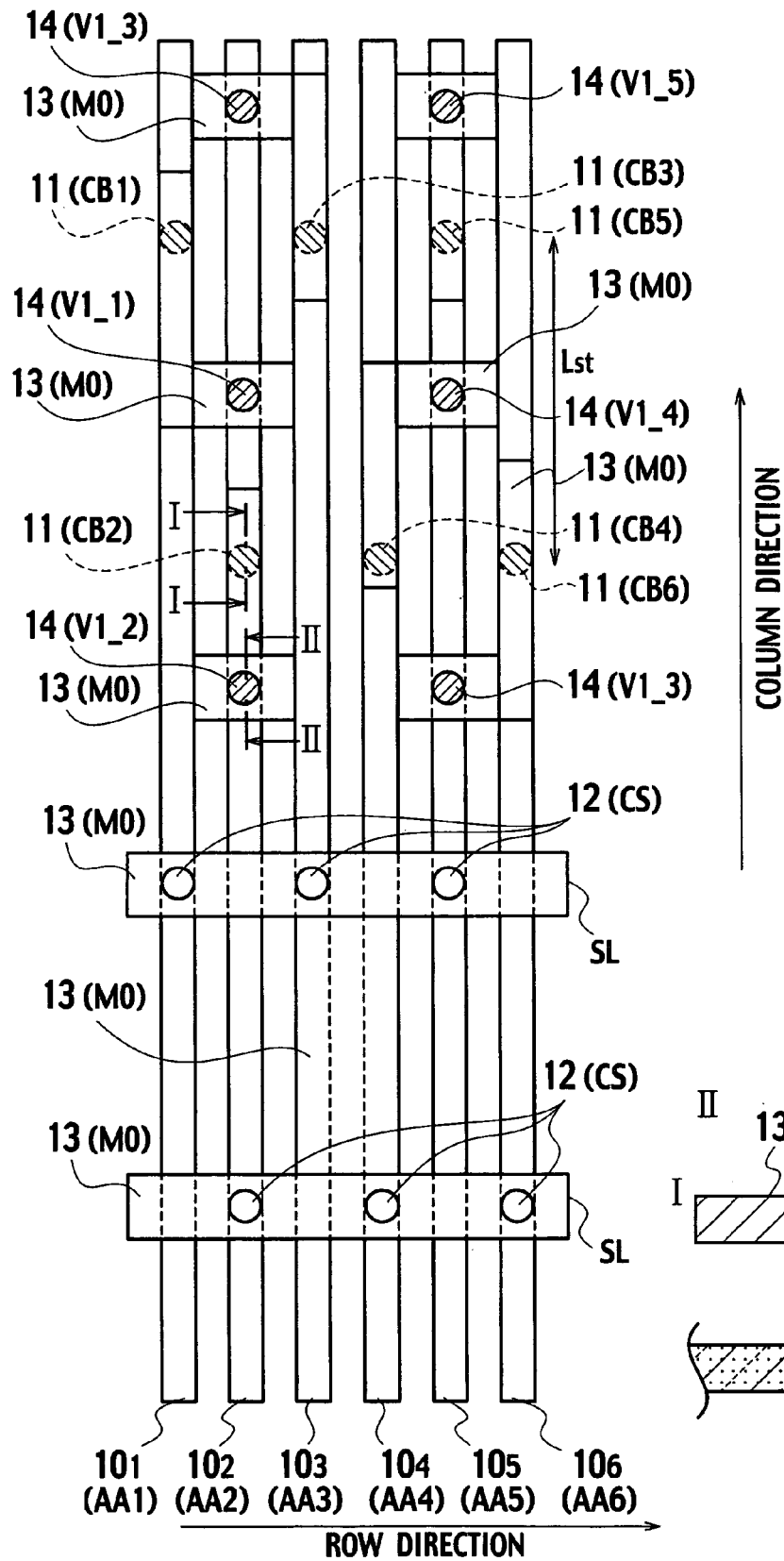
FIG. 7A is a schematic device planar pattern diagram of the semiconductor memory, particularly the nonvolatile semiconductor memory, according to a second embodiment of the present invention, which has bit line contacts (CB), first metal layers (MO), and first via contacts (V1) formed on active regions (AA)
Figure 7B:
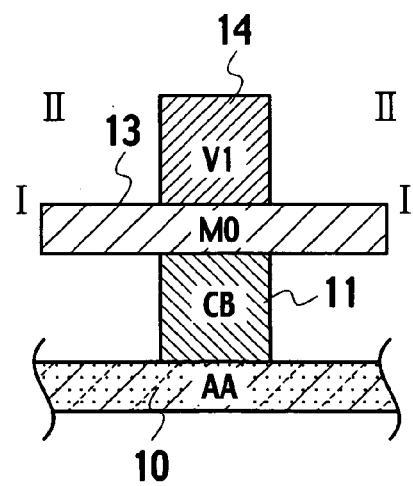
FIG. 7B is a schematic cross-sectional diagram of the semiconductor memory, particularly the nonvolatile semiconductor memory, according to the second embodiment of the present invention, cut along the lines I-I and II-II of FIG. 7A.
Figure 8A:
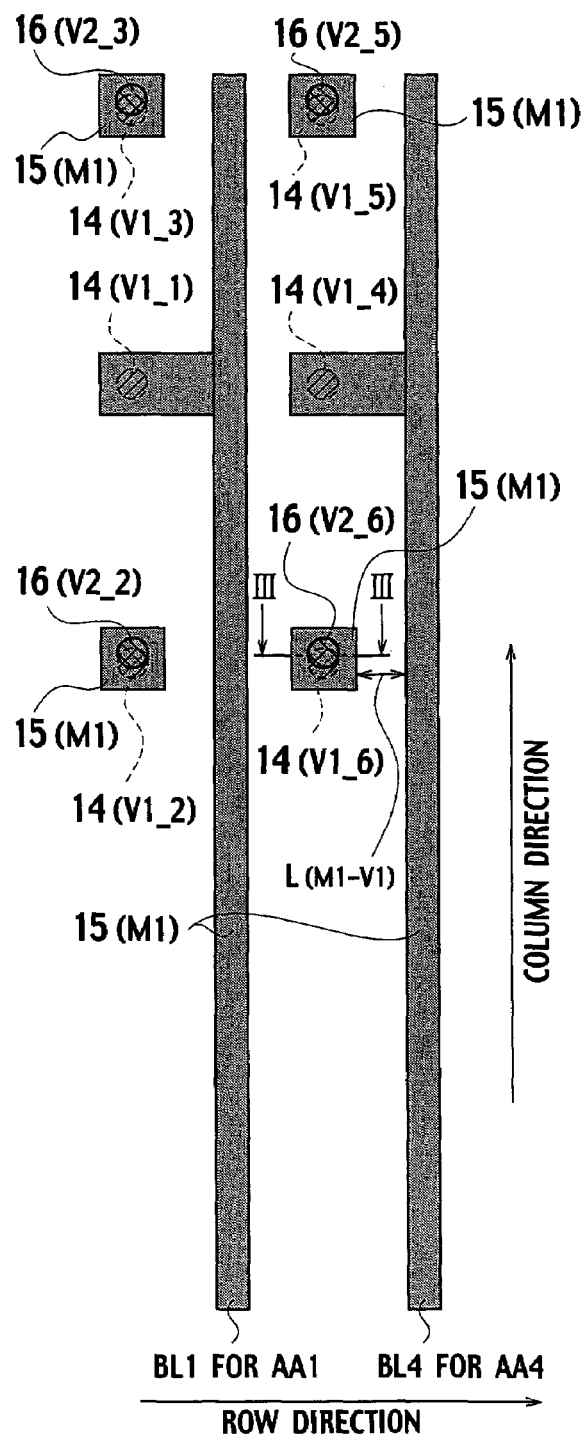
FIG. 8A is a schematic device planar pattern diagram of the semiconductor memory, particularly the nonvolatile semiconductor memory, according to the second embodiment of the present invention, which has second metal layers (M1) and second via contacts (V2) formed on the respective first via contacts (V1)
Figure 8B:
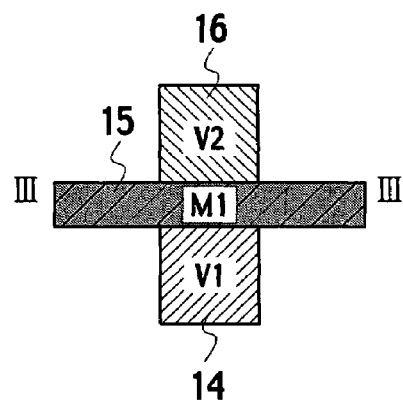
FIG. 8B is a schematic cross-sectional diagram of the semiconductor memory, particularly the nonvolatile semiconductor memory, according to the second embodiment of the present invention, cut along the line III-III of FIG. 8A.

A shown in FIGS. 7 and 8, a semiconductor memory according to the second embodiment of the present invention comprises multiple active regions $10_1$ (AA1), $10_2$ (AA2), $10_3$ (AA3), $10_4$ (AA4), $10_5$ (AA5), $10_6$ (AA6), . . . ; multiple bit line contacts 11 (CB1), 11 (CB2), 11 (CB3), 11 (CB4), 11 (CB5), 11 (CB6) and source line contacts 12 (CS) arranged on the respective active regions $10_1$ (AA1), $10_2$ (AA2), $10_3$ (AA3), $10_4$ (AA4), $10_5$ (AA5), $10_6$ (AA6), . . . . Also included are first local lines in contact with the respective bit line contacts 11 (CB1), 11 (CB2), 11 (CB3), 11 (CB4), 11 (CB5), 11 (CB6) and made of multiple first metal layers 13 (M0) formed in an island shape; source lines SL, each connected in common to the source line contacts 12 (CS), made of the first metal layers 13 (M0) and linearly extended along the word line WL length; multiple first via contacts 14 (V1_1), 14 (V1_2), 14 (V1_3) or first via contacts 14 (V1_4), 14 (V1_5), 14 (V1_6), in contact with the first local lines and arranged in a column parallel to the active regions (along the bit line BL length). Further included is a first bit line group (BL1 and BL4 of FIG. 4, for example) formed of respective second metal layers 15 (M1), in contact with one of the first via contacts 14 (V1_1) and 14 (V1_4) of the multiple first via contacts 14 (V1), and extending in a direction parallel to the active regions; and multiple second via contacts 16 (V2_2, 16 (V2_3), 16 (V2_5), and 16 (V2_6) disposed on the first via contacts 14 (V1_2) and 14 (V1_3) or 14 (V1_5) and 14 (V1_6) of the multiple first via contacts 14 (V1) that are not in contact with the first bit line group through second local lines of a second metal layers 15 (M1).

Figure 9A:
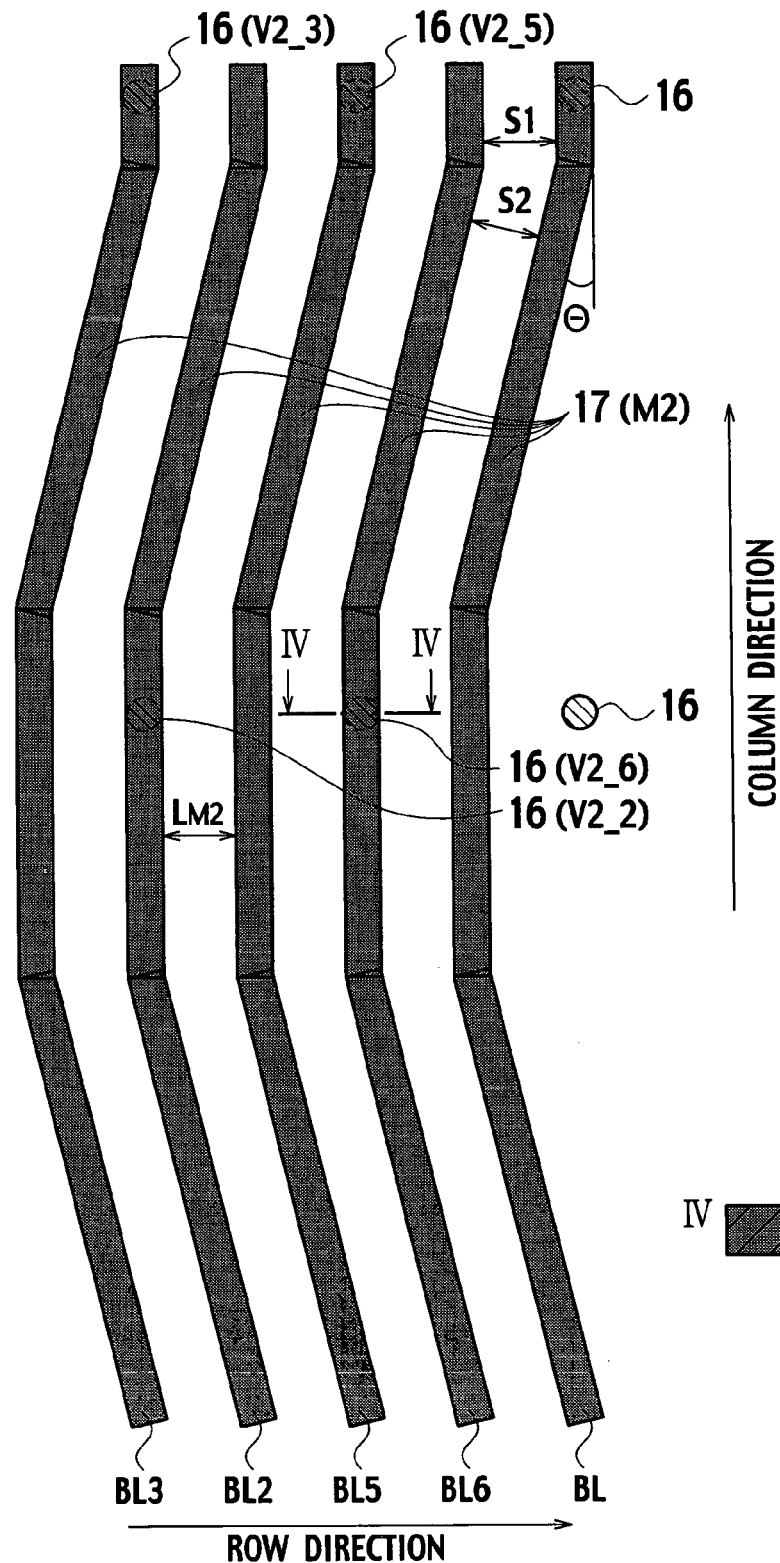
FIG. 9A is a schematic device planar pattern diagram of the semiconductor memory, particularly the nonvolatile semiconductor memory, according to the second embodiment of the present invention, which has third metal layers (M2) formed on the second via contacts (V2)
Figure 9B:
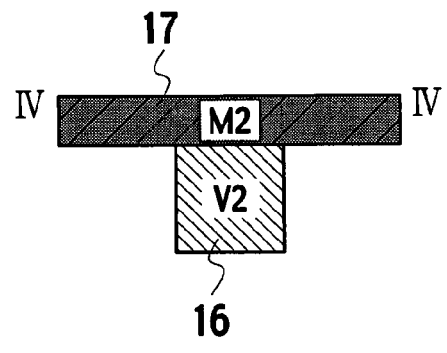
FIG. 9B is a schematic cross-sectional diagram of the semiconductor memory, particularly the nonvolatile semiconductor memory, according to the second embodiment of the present invention, cut along the line IV-IV of FIG. 9A.

As shown in FIG. 9, the semiconductor memory according to the second embodiment further comprises a second bit line group (BL2, BL3, BL5 and BL6 of FIG. 9, for example)

formed of a third metal layers 17 (M2), in contact with one of the second via contacts 16 (V2_2), 16 (V2_3), 16 (V2_5) and 16 (V2_6) of the multiple second via contacts 16 (V2_2, 16 (V2_3), 16 (V2_5), and 16 (V2_6) and having portions extending in a direction parallel to the active regions or slanted interconnects.

The semiconductor memory according to the second embodiment, compared to the first embodiment, has one less interconnect layer.

(Semiconductor Memory Fabrication Method)

A semiconductor memory fabrication method, according to the second embodiment, relaxes intervals between the bit lines BL, as shown in FIGS. 7 through 9.

A shown in FIGS. 7 through 9, the semiconductor memory fabrication method according to the second embodiment comprises: forming multiple bit line contacts 11 (CB1), 11 (CB2), 11 (CB3), 11 (CB4), 11 (CB5), 11 (CB6) and source line contacts 12 (CS) arranged on respective active regions $10_1$ (AA1), $10_2$ (AA2), $10_3$ (AA3), $10_4$ (AA4), $10_5$ (AA5), $10_6$ (AA6), . . . ; forming first local lines, in contact with the respective bit line contacts 11 (CB1), 11 (CB2), 11 (CB3), 11 (CB4), 11 (CB5), 11 (CB6), made of multiple first metal layers 13 (MO) formed in an island shape, and source lines SL, each connected in common to the source line contacts 12 (CS), of the first metal layers 13 (MO) and linearly extended along the word line WL length; and forming multiple first via contacts 14 (V1_1), 14 (V1_2), 14 (V1_3) or first via contacts 14 (V1_4), 14 (V1_5), 14 (V1_6) in contact with the first local lines and arranged in a column parallel to the active regions (column direction: along the bit line BL length). The method also includes forming a first bit line group (BL1 and BL4 of FIG. 4, for example) of the second metal layers 15 (M1) to contact the first via contacts 14 (V1_1) and 14 (V1_4) of the multiple first via contacts 14 (V1), and extending in a direction parallel to the active regions; and forming multiple second via contacts 16 (V2_2, 16 (V2_3), 16 (V2_5), and 16 (V2_6) disposed on the first via contacts 14 (V1_2) and 14 (V1_3) or 14 (V1_5) and 14 (V1_6) of the multiple first via contacts 14 (V1) that do not contact the first bit line group through second local lines of the second metal layers 15 (M1).

As shown in FIG. 9, the semiconductor memory fabrication method according to the second embodiment further comprises: forming third local lines contact with the multiple second via contacts 16 (V2_2), 11 (V2_3), 16 (V2_5), and 16 (V2_6) and made of the third metal layers 17 (M2); and forming a second bit line group (BL2, BL3, BL5 and BL6 of FIG. 9, for example) formed of the third local lines in contact with one of the second via contacts 16 (V2_2), 16 (V2_3), 16 (V2_5) and 16 (V2_6) of the multiple second via contacts 16 (V2), and having portions extending in a direction parallel to the active regions or slanted interconnects.

The fabrication method for the semiconductor memory, according to the second embodiment, for relaxing intervals between the bit lines BL is described in further detail.

Firstly, as shown in FIG. 7, the first via contacts 14 (V1_1), 14 (V1_2), and 14 (V1_3) connected to the bit line contacts 11 (CB) on three active regions $10_1$ (AA1), $10_2$ (AA2), and $10_3$ (AA3), respectively, are disposed, for example, right above a single line along the bit line BL length such as active region $10_2$ (AA2) using the local lines of the first metal layers 14 (MO).

In the same manner, as shown in FIG. 7, the first via contacts 14 (V1_4), 14 (V1_5), and 14 (V1_6) connected to the bit line contacts 11 (CB) on three active regions $10_4$ (AA4), $10_5$ (AA5), and $10_6$ (AA6), respectively, are disposed, for example, right above a single line along the bit line BL length such as active region $10_5$ (AA5).

Accordingly, the bit line contacts (CB) are formed in every other active region patterned along the word line WL length. This structure is possible because there is ample space to dispose the first via contacts 14 (V1), because the pitch of the first via contacts 14 (V1) along the bit line BL length is sufficiently longer than the pitch along the word line WL length, as shown in FIG. 17, for example. In other words, the first via contacts 14 (V1_1), 14 (V1_2) and 14 (V1_3) or 14 (V1_4), 14 (V1_5) and 14 (V1_6) connected to multiple active regions $10_1$ (AA1), $10_2$ (AA2) and $10_3$ (AA3) or $10_4$ (AA4), $10_5$ (AA5) and $10_6$ (AA6) can be disposed in the same line, respectively, utilizing the ample space.

Accordingly, the word line WL direction pitch of the first via contacts 14 (V1) is 3F.

Next, as shown in FIG. 8, the first via contacts 14 (V1_1) and 14 (V1_4) are respectively connected using the bit lines BL1 and BL4 of the second metal layers 15. The second local lines of the second metal layers 15 (M1) are formed at the other first via contacts 14 (V1_2) and 14 (V1_3).

The distance between the center of each of the bit lines BL1 and BL4 and the center of an adjacent one of the first via contacts 14 (V1) is 3F. The width of BL1 and BL4 may be set between 1F and 1.5F. For example, if the width of BL1 and BL4 is F, the distance $L_{(M1\text{-}V1)}$ of the smallest space portion is 2F. Otherwise, if the width of BL1 and BL4 is 1.5F, the distance $L_{(M1\text{-}V1)}$ of the smallest space is 1.5F. Therefore, it is understood that the distance $L_{(M1\text{-}V1)}$ of the smallest space can be relaxed to between 1.5F to 2F by comparison to the conventional case.

Even the distance $L_{(M1\text{-}V1)}$ of the smallest spaces of the bit lines BL1 and BL4 is 1.5F to 2F, thereby relaxing the design rule.

Next, as shown in FIG. 8, the second via contacts 16 (V2_2), 16 (V2_3), 16 (V2_5), and 16 (V2_6) are formed on the first via contacts 14 (V1_2), 14 (V1_3), 14 (V1_5), and 14 (V1_6), which are not connected to the bit lines BL1 and BL4, through the second local lines made of the second metal layers 15 (M1).

Next, as shown in FIG. 9, the second via contacts 16 (V2_2), 16 (V2_3), 16 (V2_5), and 16 (V2_6) are respectively connected using the bit lines BL2, BL3, BL5, and BL6 made of the third metal layers 17 (M2).

What is different from the first embodiment, as shown in FIG. 9, is that the second via contacts 16 (V2_2), 16 (V2_3), 16 (V2_5), and 16 (V2_6) are respectively connected while maintaining the distance $L_{M2}$ of the smallest spaces of the bit lines BL2, BL3, BL5, and BL6 between 1.5F and 2F by gently bending the bit lines BL.

Assuming the angle of bend of the bit lines BL as θ, a relationship between S1 and S2 is represented by $$S2 = S1 \times \cos\theta \quad (1)$$

where the distance S2 is narrower than distance S1. However, if the angle of bend θ is set small enough, S2 may be set approximately equal to S1. Accordingly, the distance S2 of the smallest spaces of the bit lines BL2, BL3, BL5, and BL6 is approximately equal to the distance $L_{M2}$ of the smallest spaces between the third metal layers (M2) extending along the word line length.

Therefore, use of three metal layers: the first metal layer 13 (MO), the second metal layer 15 (M1), and the third metal layer 17 (M2) relaxes the distance between the smallest spaces to 1.5F to 2F.

The number of metal layers is not limited to three. In general, the pitch may be relaxed to n/2 times by using n metal layers (n is an integer of 3 or greater).

Use of a lattice arrangement of the second via contacts 16 (V2) and diagonal interconnects in the third metal layers 17 (M2) constituting the bit lines BL2, BL3, BL5, and BL6, allows simultaneous formation of the bit lines BL2, BL3, BL5, and BL6 while maintaining an inter-M2 pitch of approximately 1.5×.

This is an extremely important method even though cost will increase due to an increase in the number of interconnect layers, in comparison to the study example shown in FIG. 17 when process costs for processing based on the minimum fabrication dimension F are high, or when processing based on the minimum fabrication dimension F is impossible. Furthermore, additional interconnect layers may be used in the combination logic circuit region without cost increase.

A proximal portion of dimensions generated between a bit line BL formed of the second metal layer 15 (M1) and corresponding via contact 14 (V1) regardless of how the bit line contacts 11 (CB) are arranged.

The structure of the semiconductor memory according to the second embodiment and the fabrication method for the same can be used without particular limitations, such as how to arrange the bit line contacts 11 (CB).

For example, as shown in FIG. 17 of the study example, the structure of the semiconductor memory according to the second embodiment and the fabrication method for the same may be applied even to the semiconductor memory with a structure of the bit line contacts (CB) closely disposed along the word line length. Alternatively, as shown in FIG. 3, the bit line contacts may also be applied to a semiconductor memory having the bit line contacts (CB) disposed with twice the pitch of the active regions AA/element isolating region STI.

In FIG. 7, a portion designated by the distance $L_{st}$ corresponds to a memory cell unit, and bit line contacts 11 (CB) on the active regions are shared between memory cell units.

With the semiconductor memory of the second embodiment, particularly with a nonvolatile semiconductor memory having a NAND circuit structure, a case of arranging bit line contacts CB is described; however, the method for arranging the bit line contacts CB may vary.

According to the nonvolatile semiconductor memory of the second embodiment and the fabrication method for the same, intervals between bit lines (BL) may be relaxed, and defects of a bit line (BL) and a via contact (VIA) due to the bit line and the via contact being very closely disposed may be prevented, thereby improving yield.

First Modified Example of the Second Embodiment (Continuous Contact Structure)

With the semiconductor memory according to a first modified example of the second embodiment, a 'continuous contact' structure is provided with the first via contacts 14 (V1) and the second via contacts 16 (V2) connected without sandwiching the second metal layers 15 (M1).

For example, in a structure comprised of the first via contact 14 (V1), the second metal layer 15 (M1), and the second via contact 16 (V2), the second metal layers 15 (M1) in contact with the first via contacts 14 (V1_2), 14 (V1_3), 14 (V1_5), and 14 (V1_6) are unnecessary if the continuous contact structure is used.

According to the semiconductor memory of the first modified example of the second embodiment, use of the continuous contact structure omits square M0, M1, and M2 having sides of the minimum dimension F and also omits fringes of square M0, M1, and M2 attached to compensate for misalignment, thereby increasing the minimum dimensional spacing.

Second Modified Example of the Second Embodiment

With the semiconductor memory according to a second modified example of the second embodiment, a 'source line LI structure' may be provided by filling polysilicon or a metal in linearly cut grooves and thereby forming source lines SL.

As shown in FIG. 7, with the semiconductor memory of the second embodiment, the source line contacts 12 (CS) stand upright and extend to the respective first metal layers 13 (M0). This structure allows formation of source lines SL. However, it is apparent that the source line contacts 12 (CS) that stand upright and extend to the respective first metal layers 13 (M0) are not always needed. With the semiconductor memory according to the second modified example, an interconnect structure is provided by filling polysilicon or a metal in linearly cut grooves and thereby forming the source lines SL.

The semiconductor memory according to the second modified example of the second embodiment has merit in that since formation of the source line contacts 12 (CS) is not necessary due to the interconnect structure provided by filling polysilicon or a metal in linearly cut grooves to form the source lines SL, the manufacturing process can be simplified.

(System Block Structure)

Figure 10:
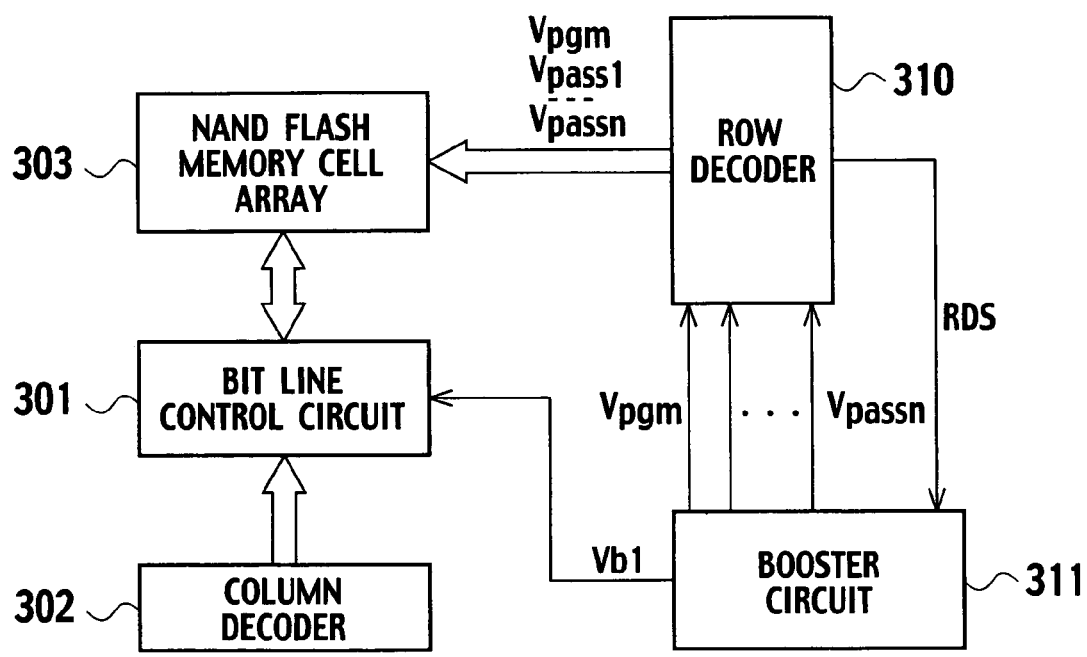
FIG. 10 is a system block diagram of a semiconductor memory, particularly a NAND nonvolatile semiconductor memory, according to the first or the second embodiment of the present invention.

The system block structure of the nonvolatile semiconductor memory, particularly the NAND nonvolatile semiconductor memory according to the first or the second embodiment of the present invention as shown in FIG. 10, comprises a NAND flash memory array 303, a bit line control circuit 301, a row decoder 310, a column decoder 302, and a booster circuit 311.

The nonvolatile semiconductor memory of the first embodiment described in FIGS. 3 through 6 may be applied to the NAND flash memory cell array 303 with either memory cell transistor structure shown in FIG. 1 and FIG. 2 or a basic structural unit. Alternatively, the semiconductor memory of the second embodiment described with FIGS. 7 through 9 may be applied.

The bit line control circuit 301 and the row decoder 310 are connected to the NAND flash memory cell array 303. The bit line control circuit 301 latches write-in data and performs a sensing operation during read-out. The column decoder 302 decodes a column address signal so as to select a NAND memory cell unit column and is connected to the bit line control circuit 301. The booster circuit 311 generates write-in voltage $V_{pgm}$, multiple intermediate voltages $V_{pass1}$ to $V_{passn}$, and bit line voltage $V_{bl}$ and the like from a power supply voltage. The row decoder 310 supplies a control signal RDS to the booster circuit 311 and receives a write-in voltage $V_{pgm}$ and intermediate voltages $V_{pass1}$ to $V_{passn}$. Note that the multiple intermediate voltages $V_{pass1}$ to $V_{passn}$ are used in the write-in, read-out and erasure operations for the nonvolatile semiconductor memory according to the first embodiment, and are mainly voltages to be applied to the control gate lines CG0 to CGn or the word lines WL1 to WLn, respectively. The row decoder 310 decodes a row address signal, and outputs based on the voltage supplied from the booster circuit 311, the resulting decoded signals, such as write-in voltage $V_{pgm}$, used to select a memory cell transistor in the NAND flash memory cell array 303, intermediate voltages $V_{pass1}$ to $V_{passn}$, voltage $V_{sgs}$ to be applied to the select gate line SGS, voltage $V_{sgd}$ to be applied to the select gate line SGD, and voltage $V_{s1}$ to be applied to the source line SL. Accordingly, the control gate lines CG0 to CGn or the word lines WL1 to WLn and the select gate lines SGS and SGD in the NAND flash memory cell array 303 are selected. The bit line control circuit 301 receives the bit line voltage $V_{b1}$ from the booster circuit 311, supplying it to a NAND memory cell unit column selected by the column decoder 302. Note that only the minimum circuit configuration is shown in FIG. 10, where an address buffer, a data input/output buffer, and a timing generation circuit and the like are also necessary, however, descriptions thereof are omitted.

(NAND Structure)

Figure 11:
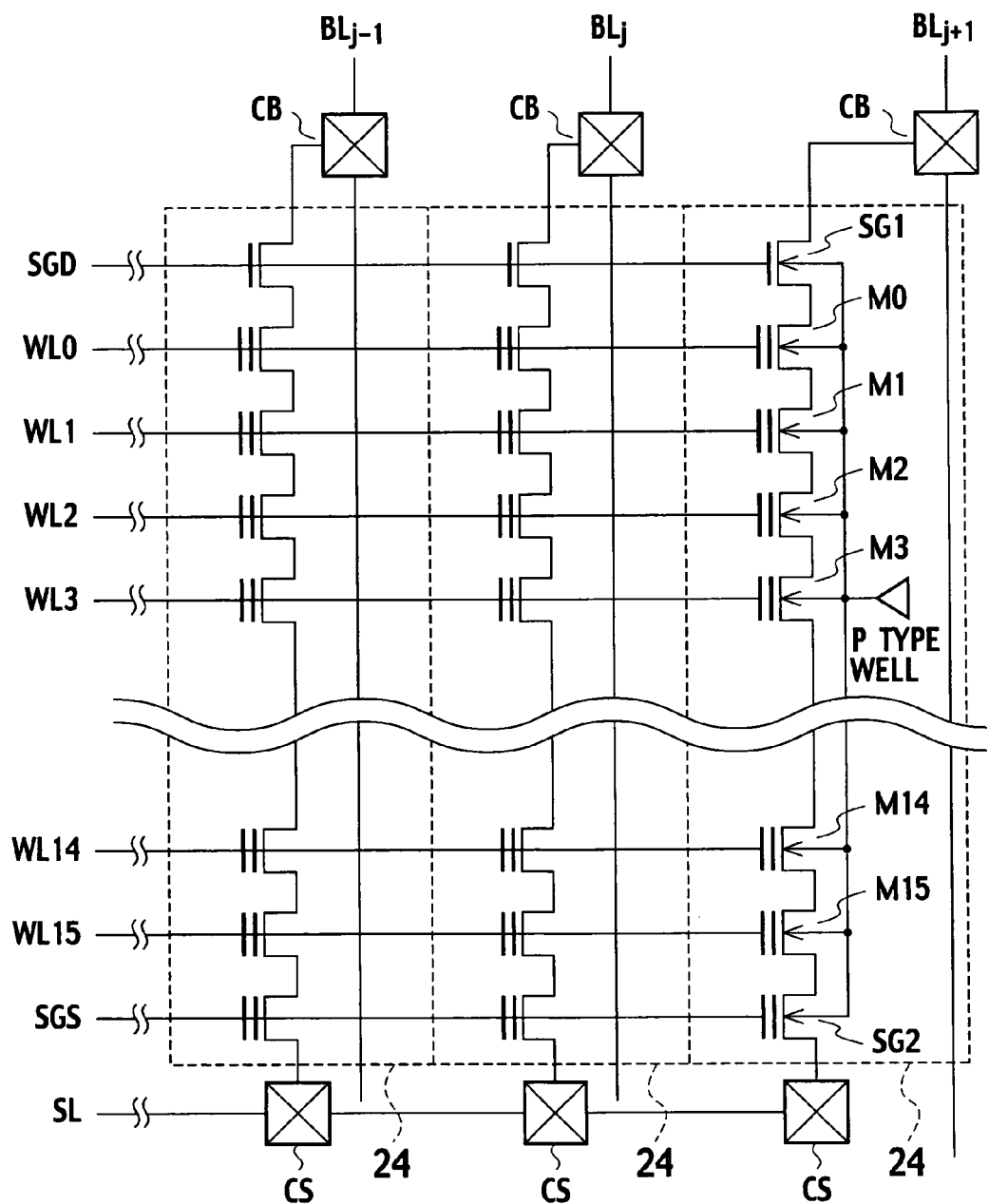
FIG. 11 is a schematic circuit diagram of the semiconductor memory, particularly the NAND nonvolatile semiconductor memory, according to the first or the second embodiment of the present invention.

FIG. 11 shows circuitry of the semiconductor memory, particularly the NAND nonvolatile semiconductor memory, according to the first or the second embodiment of the present invention.

NAND cell units 24 comprise memory cell transistors M0 through M15 and select gate transistors SG1 and SG2, as shown in detail in FIG. 11. The drains of the select gate transistors SG1 are connected to bit lines . . . , $BL_{j-1}$, $BL_j$, $BL_{j+1}$, . . . via respective bit line contacts CB. The sources of the select gate transistors SG2 are connected to the common source line SL via respective source line contacts CS.

In respective NAND cell units 24, word lines WL0 through WL 15 are connected to the control gates of the memory cell transistors M0 through M15, and select gate lines SGS and SGD are connected to the gates of the select gate transistors SG1 and SG2, respectively.

The NAND nonvolatile semiconductor memory shown in FIG. 11 comprises a memory cell transistor with a stacked gate structure, shown in FIG. 2, as a basic structure. Multiple memory cell transistors M0 through M15 are connected in series along the bit line length via source and drain diffusion layers 4 of respective memory cell transistors, constituting a single NAND string.

As a result, the described structure constitutes each of the NAND memory cell units 24, arranged in parallel along the word line WL length orthogonal to the bit lines BL.

Third Embodiment (AND Structure)

Figure 12:
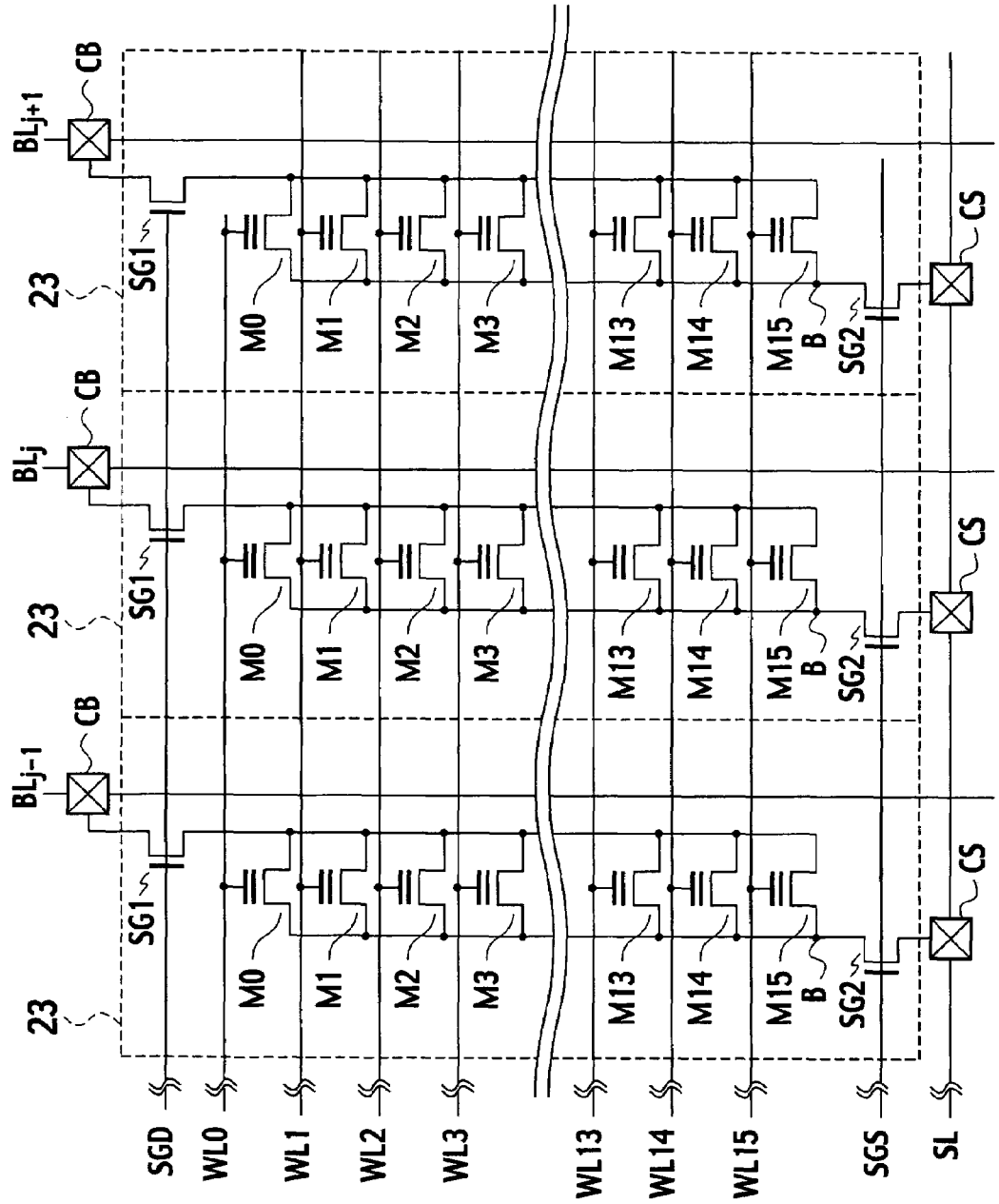
FIG. 12 is a schematic circuit diagram of a semiconductor memory, particularly an AND nonvolatile semiconductor memory, according to a third embodiment of the present invention.

FIG. 12 shows circuitry of a semiconductor memory, particularly an AND nonvolatile semiconductor memory, according to the third embodiment of the present invention. The AND nonvolatile semiconductor memory, shown in FIG. 12, comprises a memory cell transistor with a stacked gate structure, shown in FIG. 2, as a basic structure.

The AND cell units 23 comprise memory cell transistors M0 through M15 connected in parallel and select gate transistors SG1 and SG2, as shown in detail in FIG. 12. The drains of the select gate transistors SG1 are connected to the bit lines . . . , $BL_{j-1}$, $BL_j$, $BL_{j+1}$, . . . via respective bit line contacts CB.

The sources of the select gate transistors SG2 are connected to the common source line SL via respective source line contacts CS.

An AND cell unit is indicated at 23, within the dotted line of FIG. 12. In each AND cell unit 23, the drain regions of the memory cell transistors M0 through M15 are connected in common and the source regions thereof are also connected in common. Word lines WL1 through WL15 are connected to the respective gates of the memory cell transistors M0 through M15. A select gate line SGD is connected to the gates of respective select gate transistors SG1, and a select gate line SGS is connected to the gates of respective select gate transistors SG2.

The semiconductor memory, particularly the AND nonvolatile semiconductor memory according to the third embodiment, as with the first embodiment shown in FIGS. 3 through 6 and the second embodiment shown in FIGS. 7 through 9, can relax intervals between bit lines BL, and prevent defects of a bit line (BL) and a via contact (VIA) due to the bit line and the via contact being very closely disposed.

In other words, the semiconductor memory, particularly the AND nonvolatile semiconductor memory according to the third embodiment, as with the first embodiment shown in FIGS. 3 through 6, employs a structure of a bit line contact 11 (CB), a first metal layer 13 (M0), a first via contact 14 (V1), a second metal layer 15 (M1), a second via contact 16 (V2), a third metal layer 17 (M2), and a third via contact 18 (V3) successively disposed on respective active regions 10 (AA).

Alternatively, as with the second embodiment shown in FIGS. 7 through 9, a structure may employ a bit line contact 11 (CB), a first metal layer 13 (M0), a first via contact 14 (V1), a second metal layer 15 (M1), a second via contact 16 (V2), and a third metal layer 17 (M2) successively disposed on respective active regions 10 (AA).

According to the semiconductor memory of the third embodiment, a nonvolatile semiconductor memory with an AND circuit structure may be provided to relax intervals between bit lines (BL) and prevents defects of a bit line (BL) and a via contact (VIA) due to the bit line and the via contact being very closely disposed.

The use of a bit line contact pitch relaxing method provides a nonvolatile semiconductor memory with an AND circuit structure with a relaxed bit line contact (CB) pitch and the bit line (BL) pitch and improves yield.

Fourth Embodiment (NOR Structure)

Figure 13:
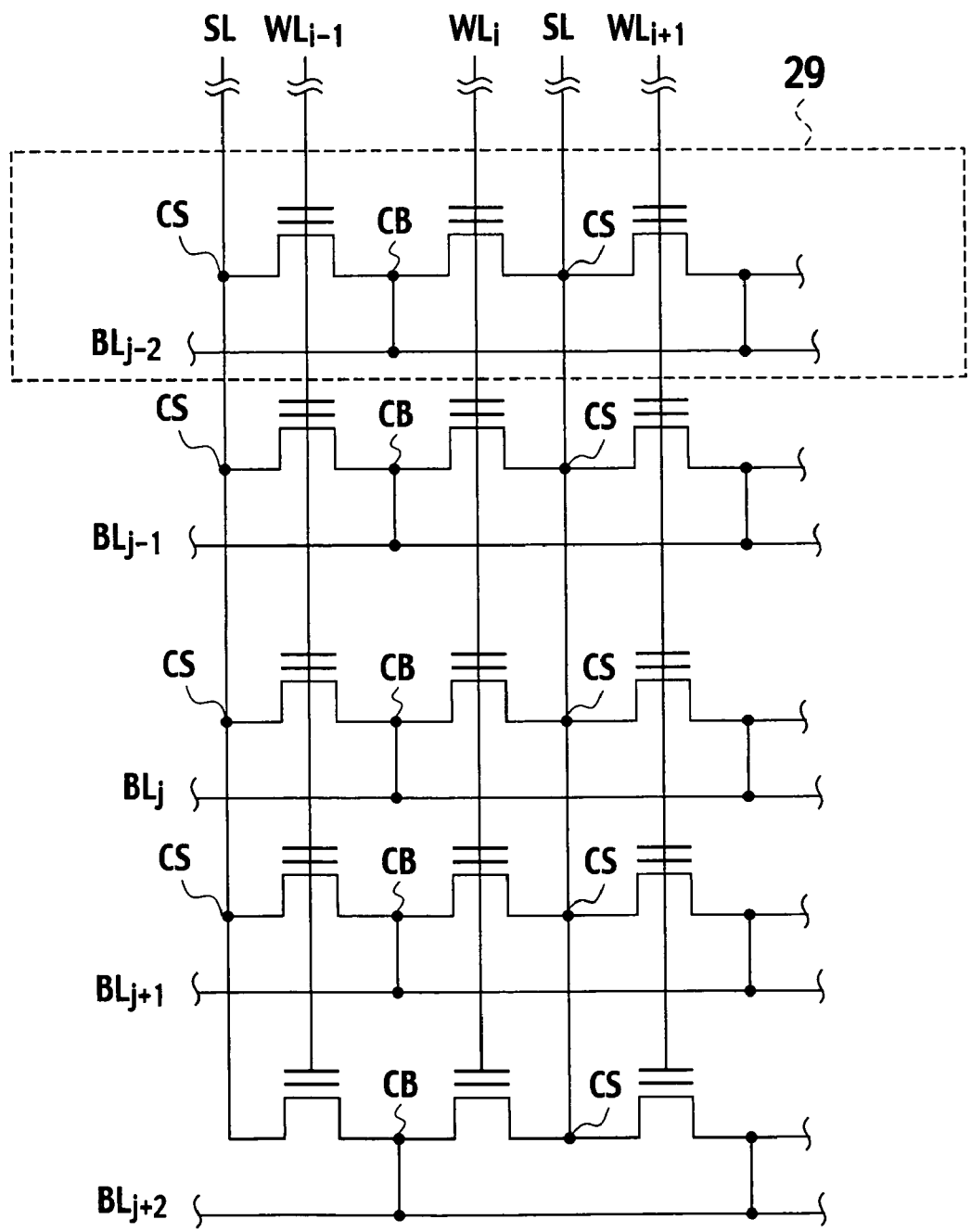
FIG. 13 is a schematic circuit diagram of a semiconductor memory, particularly a NOR nonvolatile semiconductor memory, according to a fourth embodiment of the present invention.

FIG. 13 shows circuitry of a semiconductor memory, particularly a NOR nonvolatile semiconductor memory, according to the fourth embodiment. The NOR nonvolatile semiconductor memory shown in FIG. 13 comprises a memory cell transistor with a stacked gate structure shown in FIG. 2.

A NOR cell unit is shown at 29 and enclosed by a dotted line in FIG. 13. In each NOR cell unit 29, the common source region of two adjacent memory cell transistors is connected to a source line SL via a source line contact CS, and the common drain region is connected to bit lines $BL_{j-2}$, $BL_{j-1}$, $BL_j$, $BL_{j+1}$, $BL_{j+2}$ via a bit line contact CB. The NOR cell unit 29 is arranged along the length of word lines $WL_{i-1}$, $WL_i$, $WL_{i+1}$, . . . orthogonal to the bit lines $BL_{j-2}$, $BL_{j-1}$, $BL_j$, $BL_{j+1}$, $BL_{j+2}$, . . . , and memory cell transistor gates connect in common to the respective word lines $WL_{i-1}$, $WL_i$, $WL_{i+1}$, . . . . The nonvolatile semiconductor memory with the NOR circuit structure allows faster reading than the NAND structure.

The semiconductor memory, particularly the NOR nonvolatile semiconductor memory according to the fourth embodiment, as with the first embodiment shown in FIGS. 4 through 6 and the second embodiment shown in FIGS. 7 through 9, can relax intervals between bit lines BL, and prevent defects of a bit line (BL) and a via contact (VIA) due to the bit line and the via contact being very closely disposed.

In other words, the semiconductor memory, particularly the NOR nonvolatile semiconductor memory according to the fourth embodiment, as with the first embodiment shown in FIGS. 4 through 6, provides a structure of a bit line contact 11 (CB), a first metal layer 13 (MO), a first via contact 14 (V1), a second metal layer 15 (M1), a second via contact 16 (V2), a third metal layer 17 (M2), and a third via contact 18 (V3) successively disposed on respective active regions 10 (AA).

Alternatively, as with the second embodiment shown in FIGS. 7 through 9, a structure may comprise a bit line contact 11 (CB), a first metal layer 13 (MO), a first via contact 14 (V1), a second metal layer 15 (M1), a second via contact 16 (V2), and a third metal layer 17 (M2) successively disposed on respective active regions 10 (AA).

According to the semiconductor memory of the fourth embodiment, a nonvolatile semiconductor memory with a NOR circuit structure is provided to relax intervals between bit lines (BL) and prevents defects of a bit line (BL) and a via contact (VIA) due to the bit line and the via contact being very closely disposed.

The use of a bit line contact pitch relaxing method provides a nonvolatile semiconductor memory with a NOR circuit structure that relaxes the bit line contact (CB) pitch and the bit line (BL) pitch and improves yield.

Fifth Embodiment (Two-Transistor/Cell Structure)

Figure 14:
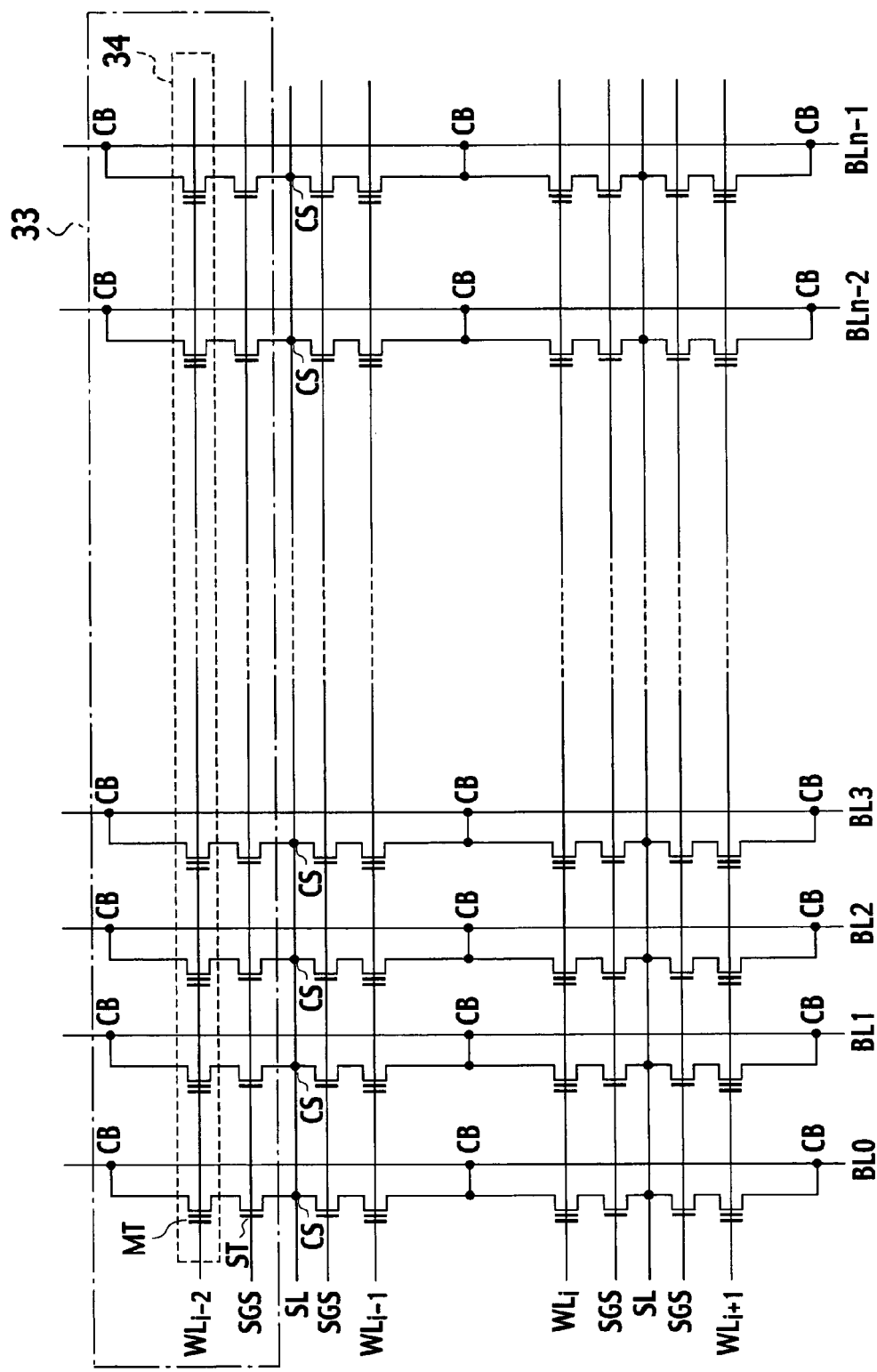
FIG. 14 is a schematic circuit diagram of a semiconductor memory, particularly a two-transistor/cell system nonvolatile semiconductor memory, according to a fifth embodiment of the present invention.

FIG. 14 shows circuitry of a semiconductor memory, particularly a two-transistor/cell system nonvolatile semiconductor memory, according to the fifth embodiment of the present invention.

The exemplary semiconductor memory according to the fifth embodiment has a basic two-transistor/cell system structure and, as shown in FIG. 14, comprises a memory cell transistor MT and a select transistor ST.

The memory cell transistor MT comprises a stacked gate structure including a gate insulating film 30 formed as a tunnel insulating film on a p-well or semiconductor substrate 26, a floating gate 8, an inter-gate insulating film, and a control gate 2 arranged on the gate insulating film 30, as shown in FIG. 2. The drain region of the memory cell transistor MT is connected to a bit line contact (CB) via a diffusion layer 4, and the source region is connected to the drain region of the select transistor ST via the diffusion layer 4. The source region of the select transistor ST is connected to a source line contact (CS) via the diffusion layer 4. Such two-transistor/cell system memory cells are arranged in parallel along the length of the word line WL and, as shown in FIG. 14, comprise a memory cell block 33.

In a single memory cell block 33, the word line $WL_{i-2}$ is connected in common to control gates 2 of respective memory cell transistors MT, comprising a page unit 34. Note that pages within multiple blocks may naturally be grouped into a page unit.

A select gate line SGS is connected in common to the gates of the select transistors ST.

Circuitry having a two-transistor/cell system memory cells symmetrically arranged with the source line SL as a line of symmetry is serially arranged along the length of bit lines BL0, BL1, BL2, . . . , BLn−1.

As a result, as shown in FIG. 14, the bit line contacts CB are linearly arranged between adjacent word lines $WL_{i-1}$, $WL_i$ along the length of the word line WL, and the source line contacts CS are linearly arranged between adjacent select gate lines SGS along the length of the word line WL.

The semiconductor memory, particularly the two-transistor/cell system nonvolatile semiconductor memory according to the fifth embodiment, as with the first embodiment shown in FIGS. 5 through 6 and the second embodiment shown in FIGS. 7 through 9, can relax intervals between bit lines BL, and prevent defects of a bit line (BL) and a via contact (VIA) due to the bit line and the via contact being very closely disposed.

In other words, the semiconductor memory, particularly the two-transistor/cell system nonvolatile semiconductor memory according to the fifth embodiment, as with the first embodiment shown in FIGS. 3 through 6, provides a structure of a bit line contact 11 (CB), a first metal layer 13 (MO), a first via contact 14 (V1), a second metal layer 15 (M1), a second via contact 16 (V2), a third metal layer 17 (M2), and a third via contact 18 (V3) successively disposed on respective active regions 10 (AA).

Alternatively, as with the second embodiment shown in FIGS. 7 through 9, a structure provides a bit line contact 11 (CB), a first metal layer 13 (MO), a first via contact 14 (V1), a second metal layer 15 (M1), a second via contact 16 (V2), and a third metal layers 17 (M2) successively disposed on the respective active regions 10 (AA).

According to the semiconductor memory of the fifth embodiment, nonvolatile semiconductor memory with a two-transistor/cell structure relaxes intervals between bit lines (BL) and prevents defects of a bit line (BL) and a via contact (VIA) due to the bit line and the via contact being very closely disposed.

A method for relaxing bit line contact pitch provides a nonvolatile semiconductor memory with a two-transistor/cell circuit structure that relaxes the bit line contact (CB) pitch and the bit line (BL) pitch and improves yield.

Sixth Embodiment (Three-Transistor/Cell Structure)

Figure 15:
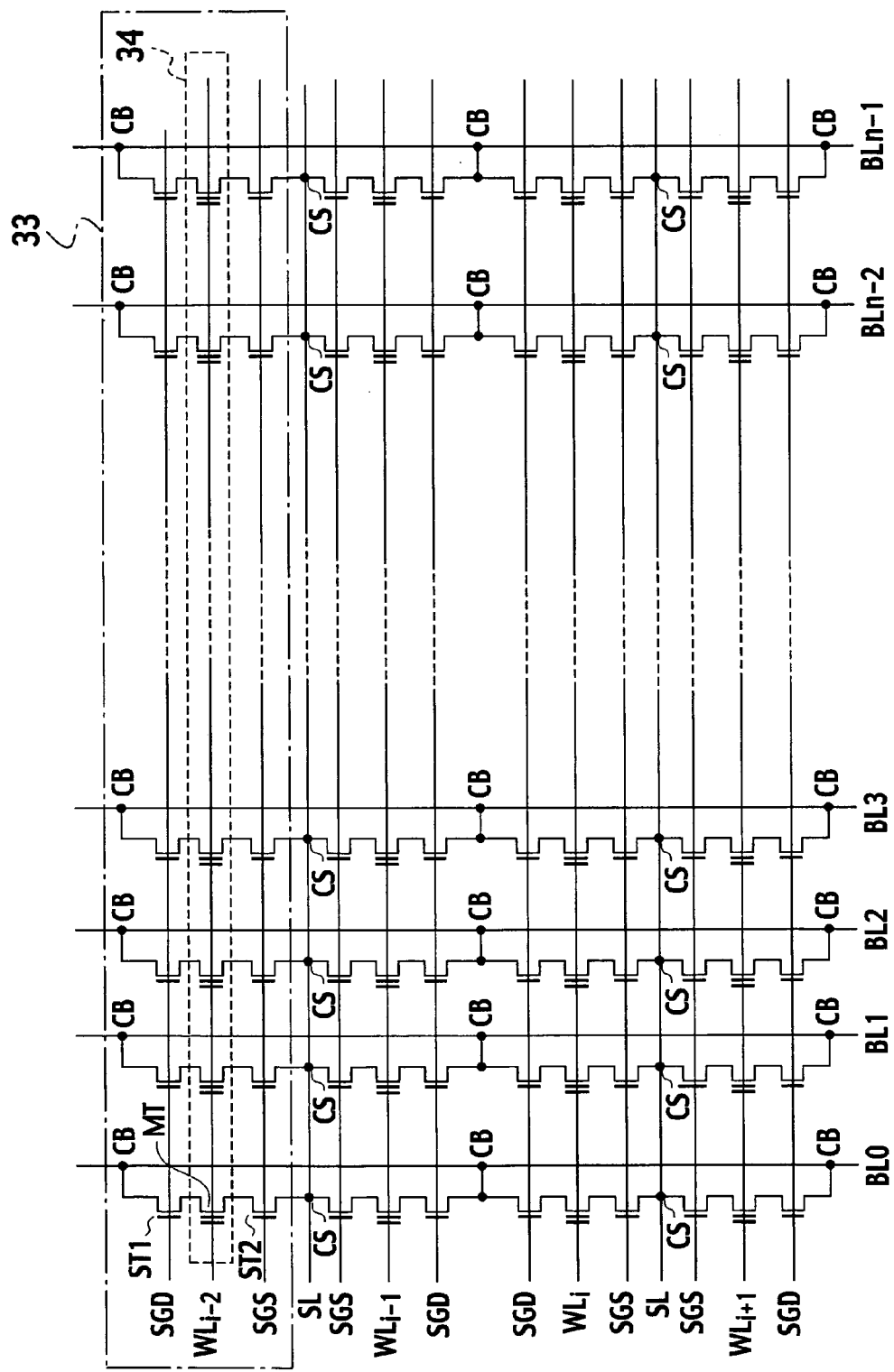
FIG. 15 is a schematic circuit diagram of a semiconductor memory, particularly a three-transistor/cell system nonvolatile semiconductor memory, according to a sixth embodiment of the present invention.

FIG. 15 shows circuitry of a semiconductor memory, particularly a three-transistor/cell system nonvolatile semiconductor memory, according to the sixth embodiment of the present invention.

The exemplary semiconductor memory according to the sixth embodiment has a basic three-transistor/cell system structure, and as shown in FIG. 15, comprises a memory cell transistor MT and select transistors ST1 and ST2.

The memory cell transistor MT comprises a stacked gate structure including a gate insulating film 30 formed as a tunnel insulating film on a p-well or semiconductor substrate 26, a floating gate 8, an inter-gate insulating film, and a control gate 2 arranged on the gate insulating film 30, as shown in FIG. 2. The select transistors ST1 and ST2 are disposed on either side of the memory cell transistor MT, respectively. The drain region of the memory cell transistor MT is connected to a bit line contact (CB) via a bit line side select transistor ST1, and the source region is connected to a source line contact (CS) via a source line side select transistor ST2. Such three-transistor/cell system memory cells are arranged in parallel along the length of the word line WL, and as shown in FIG. 15, configure a memory cell block 33. In a single memory cell block 33, the word line $WL_{i-2}$ is connected in common to control gates 2 of respective memory cells, configuring a page unit 34. Note that pages within multiple blocks may naturally be grouped into a page unit. A select gate line SGS is connected in common to the gates of the source line side select transistors ST2, and a select gate line SGD is connected in common to the gates of the bit line side select transistors ST1. Circuitry having three-transistor/cell system memory cells symmetrically arranged with the source line SL as a line of symmetry is arranged in series along the length of bit lines BL0, BL1, BL2, . . . , BLn−1.

As a result, as shown in FIG. 15, the bit line contacts CB are linearly arranged between adjacent select gate lines SGD along the length of the word line WL, and the source line contacts CS are linearly arranged between adjacent select gate lines SGS along the length of the word line WL.

The semiconductor memory, particularly the three-transistor/cell system nonvolatile semiconductor memory according to the sixth embodiment of the present invention, as with the first embodiment shown in FIGS. 6 through 6 and the second embodiment shown in FIGS. 7 through 9, can relax intervals between bit lines BL, and prevent defects of a bit line (BL) and a via contact (VIA) due to the bit line and the via contact being very closely disposed.

In other words, the semiconductor memory, particularly the three-transistor/cell system nonvolatile semiconductor memory according to the sixth embodiment, as with the first embodiment shown in FIGS. 3 through 6, provides a structure of a bit line contact 11 (CB), a first metal layer 13 (MO), a first via contact 14 (V1), a second metal layer 15 (M1), a second via contact 16 (V2), a third metal layer 17 (M2), and a third via contact 18 (V3) successively disposed on respective active regions 10 (AA).

Alternatively, as with the second embodiment shown in FIGS. 7 through 9, a structure provides a bit line contact 11 (CB), a first metal layer 13 (MO), a first via contact 14 (V1), a second metal layer 15 (M1), a second via contact 16 (V2), and a third metal layer 17 (M2) successively disposed on respective active regions 10 (AA).

According to the semiconductor memory of the sixth embodiment, a nonvolatile semiconductor memory with a three-transistor/cell structure is provided that relaxes intervals between bit lines (BL) and prevents defects of a bit line (BL) and a via contact (VIA) due to the bit lines and via contacts being very closely disposed.

A bit line contact pitch relaxing method provides a nonvolatile semiconductor memory with a three-transistor/cell circuit structure that relaxes the bit line contact (CB) pitch and the bit line (BL) pitch, and improves yield.

Application Example

Figure 16:
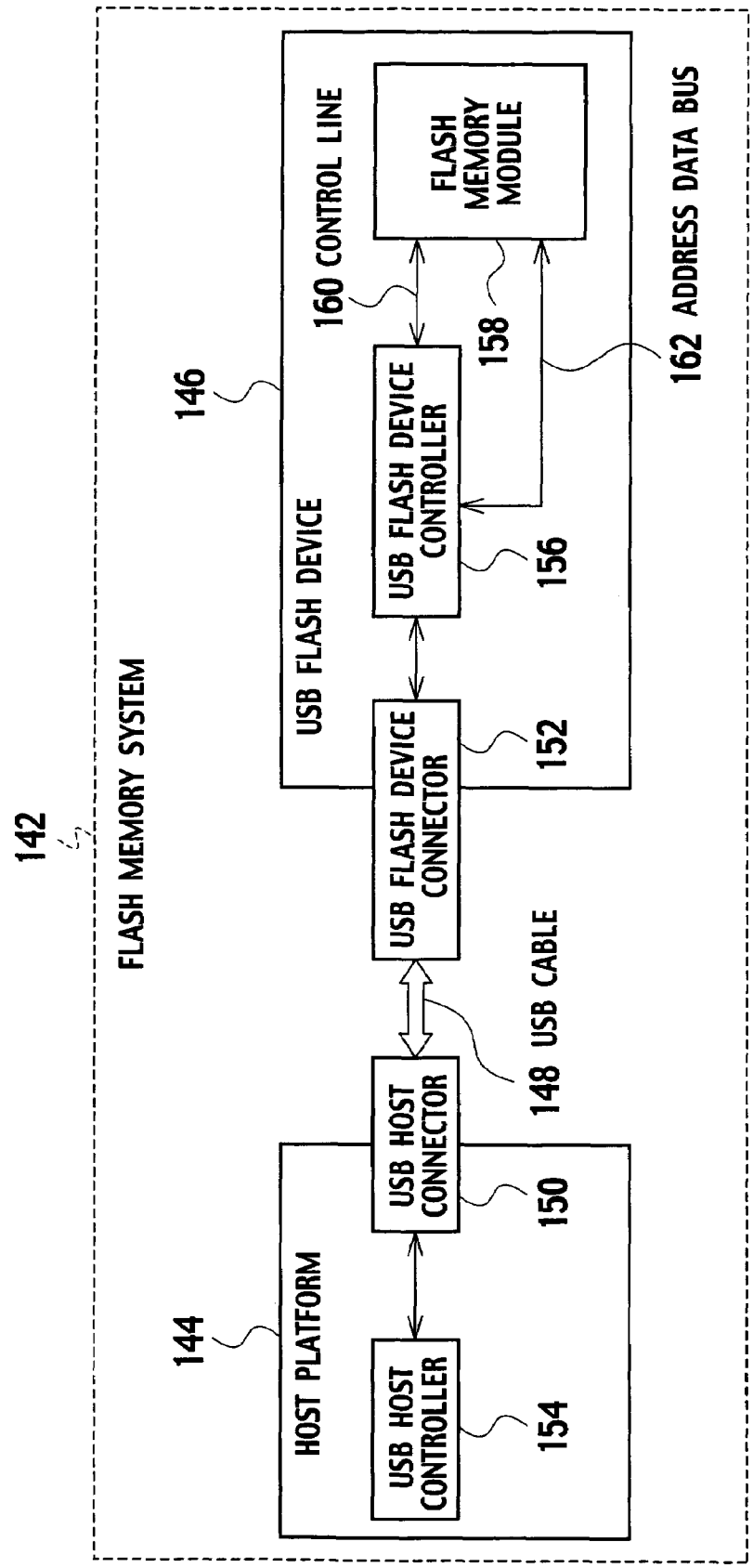
FIG. 16 is a schematic diagram of principal elements of a flash memory device and system using the semiconductor memory, according to the embodiments of the present invention.

FIG. 16 shows an application example of the semiconductor memory according to the first through the sixth embodiment of the present invention. FIG. 16 is a schematic diagram of principal elements of a flash memory device and system implemented by the semiconductor memory, particularly the nonvolatile semiconductor memory according to the embodiments of the present invention. As shown in the drawing, a flash memory system 142 comprises a host platform 144 and a universal serial bus (USB) flash unit 146.

The host platform 144 is connected to the USB flash unit 146 embedded with the nonvolatile semiconductor memory, according to the embodiments of the present invention, via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 comprises a USB flash unit controller 156, which controls other elements in the USB flash unit 146 and also controls the interface to the USB bus of the USB flash unit 146; the USB flash unit connector 152; and at least one flash memory module 158 comprising the nonvolatile semiconductor memory according to the first through the sixth embodiment of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/to the USB flash unit 146 via a FIFO buffer called an end point that stores transfer data. The host platform 144 recognizes changes in the physical and electrical states, such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet through the USB cable 148. If the USB flash unit 146 is a unit including the end point that has received the request packet, the request is accepted by the USB flash unit controller 156.

Next, the USB flash unit controller 156 performs various operations such as read-in, write-in or erasure of data from or to the flash memory module 158. In addition, the USB flash unit controller 156 supports basic USB functions such as acquiring a USB address and the like. The USB flash unit controller 156 controls the flash memory module 158 via either a control line 160 used to control output from the flash memory module 158, or, for example, other various signals such as a chip enable signal CE, a read-out signal or a write-in signal. The flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the result and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148.

Other Embodiments

As described above, the present invention is described according to the first through the sixth embodiment; however, it should not be perceived that descriptions forming part of this disclosure and the drawings are intended to limit the spirit and scope of the present invention. Various alternative embodiments, working examples, and operational techniques will become apparent from this disclosure for those skilled in the art.

For example, the first through the second embodiment of the present invention mainly describe a two-valued NAND EEPROM. However, the present invention is applicable to a multi-valued cell NAND EEPROM of three values or more. For example, a four-valued NAND EEPROM provides a memory capacity twice that of the two-valued NAND EEPROM. In addition, the present invention is applicable to a multi-valued (m-valued) cell NAND EEPROM (m>3) or more.

Furthermore, the semiconductor memory according to the embodiments of the present invention and the fabrication method for the same may apply in the same way to a dynamic random access memory (DRAM) such as synchronous dynamic random access memory (SDRAM), double data rate SDRAM (DDR-SDRAM), double data rate first cycle random access memory (DDR-FCRAM) or the like.

In this manner, the present invention naturally includes various embodiments not described herein. Accordingly, the technical scope of the present invention is determined only by specified features of the invention according to appended claims that can be construed appropriate from the above-mentioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A semiconductor memory comprising:
   a plurality of active regions;
   a plurality of bit line contacts disposed on respective active regions;
   a plurality of first local lines formed in an island shape and in contact with upper surfaces of the plurality of bit line contacts;
   a plurality of first via contacts in contact with the upper surfaces of the plurality of first local lines respectively;
   a first bit line in contact with a second via contact which is one of the plurality of first via contacts and extending in a direction parallel to the active regions;
   a second bit line in contact with a third via contact which is one of the plurality of first via contacts and is not in contact with the second via contact, the second bit line is adjacent to the first bit line and extending in a direction parallel to the active regions; and
   a plurality of fourth via contacts arranged above fifth via contacts which are among the plurality of first via contacts and adjacent to the second via contact or the third via contact in a direction parallel to the active regions, and the fifth via contacts not being in contact with the first bit line and the second bit line through respective second local lines,
   wherein a space between the first bit line and the second bit line is wider than a space between the active regions.

2. The semiconductor memory of claim 1, further comprising third bit lines, each in contact with one of the plurality of fourth via contacts, and extending in a direction parallel to the active regions,
   wherein the third bit lines are arranged in a different layer from the first bit line and the second bit line.

3. The semiconductor memory of claim 2, further comprising:
   a plurality of third via contacts arranged above the second via contacts that are not in contact with the second bit lines through respective third local lines; and
   a third bit line in contact with one of the plurality of third via contacts and extending in a direction parallel to the active regions.

4. The semiconductor memory of claim 2, wherein the third bit lines include slanted interconnects.

5. The semiconductor memory of claim 4, wherein the fourth via contacts are arranged in a lattice.

6. The semiconductor memory of claim 1, further comprising source lines extending in a direction orthogonal to a direction in which the active regions extend.

7. The semiconductor memory of claim 6, wherein the source lines are in contact with respective source line contacts disposed on the respective active regions, and comprise the same material as the first local lines.

8. The semiconductor memory of claim 6, wherein the source lines comprise an interconnect structure of linearly cut grooves with one of a polysilicon and a metal filled therein.

9. The semiconductor memory of claim 1, wherein second local lines arranged between the first bit line and second bit line.

* * * * *